United States Patent [19]
Tessmer et al.

[11] Patent Number: 5,458,733
[45] Date of Patent: Oct. 17, 1995

[54] METHOD FOR ETCHING A DIAMOND FILM

[75] Inventors: Glenn J. Tessmer, Cary; Brian R. Stoner, Chapel Hill; David L. Dreifus, Cary, all of N.C.

[73] Assignee: Kobe Steel USA, Inc., Research Triangle Park, N.C.

[21] Appl. No.: 223,521

[22] Filed: Apr. 5, 1994

Related U.S. Application Data

[63] Continuation-in-part of Ser. No. 937,481, Aug. 28, 1992, Pat. No. 5,397,428, which is a continuation-in-part of Ser. No. 811,425, Dec. 20, 1991, abandoned.

[51] Int. Cl.$^6$ ............................................. B05D 5/00
[52] U.S. Cl. ................................. 216/67; 216/81
[58] Field of Search ........................ 156/643, 646, 156/654; 204/192.35

[56] References Cited

U.S. PATENT DOCUMENTS

| | | | |
|---|---|---|---|
| 4,339,304 | 7/1982 | Grigoriev et al. | 156/646 X |
| 4,756,794 | 7/1988 | Yoder | 156/643 |
| 4,957,591 | 9/1990 | Sato et al. | 156/643 |
| 4,980,021 | 12/1990 | Kitamura et al. | 156/643 |
| 5,022,959 | 6/1991 | Itoh et al. | 156/643 |
| 5,160,405 | 11/1992 | Miyauchi et al. | 156/643 |

OTHER PUBLICATIONS

S. J. Pearton et al., "ECR Plasma Etching of Chemically Vapour Deposited Diamond Thin Films," Electronics Letters, vol. 28, No. 9 (1992).
Charles P. Beetz, Jr. et al., "ECR Plasma Etching of Natural Type IIa and Synthetic Diamonds," New Diamond Science and Technology (1991) MRS Int. Conf. Proc., pp. 833–838.
S. A. Grot et al., "Oxygen Based Electron Cyclotron Resonance Etching of Semiconducting Homoepitaxial Diamond Films," Appl. Phys. Lett., vol. 61, No. 19 (1992), pp. 2326–2328.
O. A. Popov, "Characteristics of Electron Cyclotron Resonance Plasma Sources," J. Vac. Sci. Technol. A., vol. 7, No. 3, May/Jun. 1989, pp. 894–898.
B. R. Stoner et al., "Epitaxial Nucleation of Diamond on β–SiC via Bias–Enhanced Microwave Plasma Chemical Vapor Deposition," Diamond and Related Materials, vol. 2 (1993), pp. 142–146; presented at Diamond Films '92, in Heidelberg, Germany, Sep. 1–4, 1992, No. 4.3 (1992).
Timothy J. Whetten et al., "Etching of Diamond with Argon and Oxygen Ion Beams," J. Vac. Sci. Technol. A, vol. 2, No. 2 (1984), pp. 477–480.
G. S. Sandhu et al, "Reactive Ion Etching of Diamond," Appl. Phys. Lett., vol. 55, No. 5 (1989), pp. 437–438.
N. N. Efremow et al., "Ion–Beam–Assisted Etching of Diamond," J. Vac. Sci. Technol. B., vol. 3, No. 1 (1985), pp. 416–418.

Primary Examiner—Thi Dang
Attorney, Agent, or Firm—Bell, Seltzer, Park & Gibson

[57] ABSTRACT

Techniques for synthesizing diamond films include a method for anisotropically etching a diamond film. The method includes the steps of selectively patterning a mask layer on a surface of a diamond film and then subjecting the mask layer and exposed surface portions of the diamond film to a hydrogen-containing plasma, while negatively biasing the diamond film to convert the exposed surface portions of the diamond layer to nondiamond carbon. Negatively biasing the diamond film in the hydrogen-containing plasma causes an emission of electrons to thereby convert exposed diamond surface portions to nondiamond carbon. The hydrogen-containing plasma continuously removes the nondiamond carbon from the surface and maintains the electron emission efficiency of the exposed diamond surface so that further etching can take place.

30 Claims, 39 Drawing Sheets

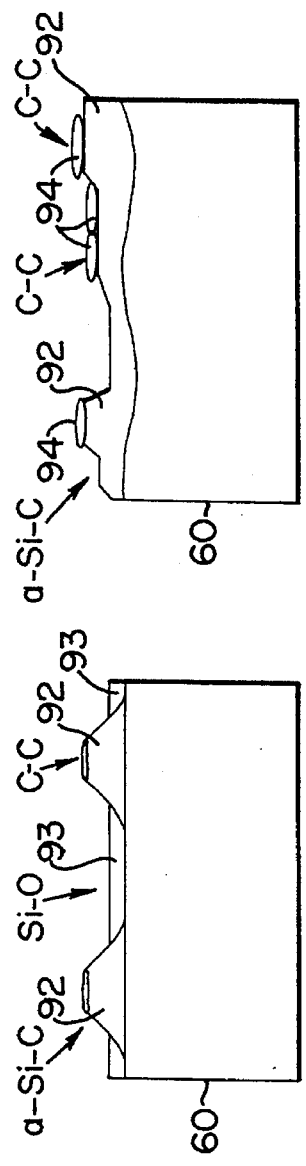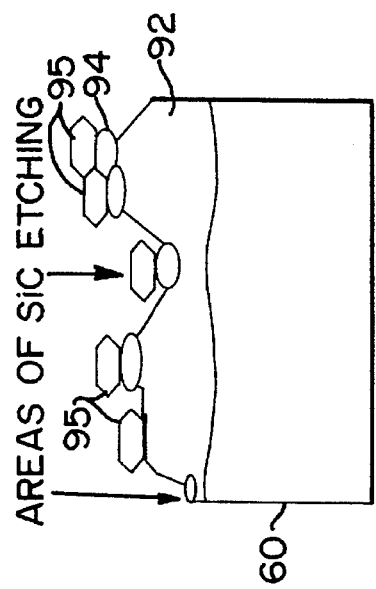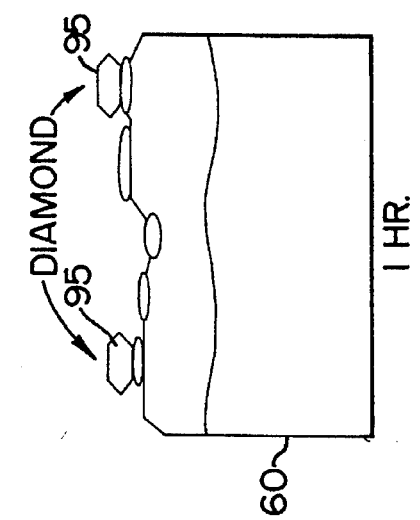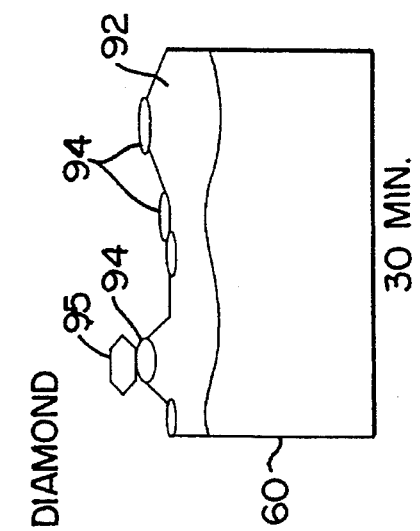
FIG. 18A. BEFORE BIAS
FIG. 18B. 5 MIN.
FIG. 18C. 15 MIN.
FIG. 18D. 30 MIN.
FIG. 18E. 1 HR.
FIG. 18F. 2 HRS.

METHOD FOR ETCHING A DIAMOND FILM

RELATED APPLICATION

This application is a continuation-in-part of application Ser. No. 07/937,481 filed Aug. 28, 1992, now U.S. Pat. No. 5,347,428 which is a continuation-in-part of application Ser. No. 07/811,425 filed Dec. 20, 1991, now abandoned.

FIELD OF THE INVENTION

The present invention relates to the field of semiconductor materials, and more particularly, to a method for etching a diamond film.

BACKGROUND OF THE INVENTION

With its large energy band gap, chemical inertness and other unique physical properties, diamond is regarded as a desirable material for many engineering applications including wear-resistant tool coatings, optical windows for visible and infrared transmission, abrasives, and particularly high temperature electronic devices. Diamond can be used as a high-grade, radiation resistant, high-temperature semiconductor with potential application in many commercial, military, and aerospace technologies.

Various techniques for forming diamond films have been proposed. For example, U.S. Pat. No. 4,915,977 to Okamoto et al. proposes forming a diamond film by evaporating carbon onto the substrate by arc discharge at a carbon cathode and applying a negative bias voltage to the substrate so as to form a plasma glow discharge around the substrate. U.S. Pat. No. 4,830,702 to Singh et al. proposes a hollow cathode plasma assisted method and apparatus for forming diamond films. Unfortunately, such electrical discharge methods for forming diamond films often fail to produce high quality diamond films, or layers.

Microwave plasma enhanced CVD has also been used to form diamond films. In addition, techniques have been developed for enhancing the nucleation of diamond onto a silicon substrate, or other substrate, for the subsequent growth of a diamond film by a conventional growth process. For example, it is well known that the diamond nucleation density on a substrate may be increased several orders of magnitude by simply scratching or abrading the substrate prior to placing it into the conventional CVD growth chamber. Although the size and density of grown diamond particles can be controlled to some extent by the size and density of the scratches, each diamond particle still grows in a random orientation. In addition, the maximum density of diamond nuclei is also typically limited to less than about $10^9/cm^2$.

Other attempts have been made to more effectively seed the nucleation process, such as by spraying the substrate with diamond powder through an air brush, or by ultrasonically abrading the substrate surface. U.S. Pat. No. 4,925,701 to Jansen et al. proposes seeding a substrate with a diamond powder to enhance nucleation. Unfortunately, each of these types of preparation techniques has to be performed outside of the plasma CVD reaction chamber.

The scratching and seeding techniques, also fail to produce a surface which is sufficiently smooth to permit in-situ monitoring of the diamond growth rate. Therefore, ex-situ analysis is commonly used, such as cross-sectional scanning electron microscopy or profilometry. Such ex-situ analysis does not permit processing parameters to be controlled during the diamond growth process.

An article entitled *Generation of Diamond Nuclei by Electric Field in Plasma Chemical Vapor Deposition*, by Yugo et al. appearing in Applied Physics Letters, 58 (10) pp. 1036–1038, Mar. 11, 1991, proposes a predeposition of diamond nuclei on a silicon mirror surface prior to the conventional diamond CVD growth process. A high methane fraction (i.e., at least 5 percent) in the feed gas is taught by Yugo along with a negative electrical bias of 70 volts negative with respect to ground applied to the substrate for a time period of just several minutes.

The Yugo article also proposes that a balance must be struck between the biasing voltage and the methane content of the gas mixture. The authors of the Yugo article theorize that an excessive acceleration of the ions from a high voltage can destroy newly formed diamond nuclei. Yugo suggests that revaporization of the newly formed diamond nuclei should be suppressed by mitigating the ion impact by keeping the magnitude of the bias voltage low. Thus, in order to offset the low bias voltage, the degree of carbon over saturation, as determined by the methane percentage, should be increased. Yugo reported that diamond nuclei growth did not occur below 5% methane content and that high densities of nuclei occurred only above 10% methane. In addition, the absolute value of the biasing voltages were maintained below 200 volts negative with respect to ground to avoid revaporization from high energy impacting ions. The total time duration for the pretreatment was limited to between 2 to 15 minutes.

It will also be desirable to produce single crystal diamond thin films over relatively large areas of a substrate in order to fully utilize diamond as a semiconductor material from which to fabricate electronic devices. Homoepitaxial growth of diamond has been reported; however, diamond substrates of sufficient size to make the process economical are not currently available. The growth of heteroepitaxial, or textured diamond films comprising a plurality of locally heteroepitaxial diamond areas, therefore, becomes an important goal if the economical fabrication of diamond electronic devices, for example, is to become a reality.

Heteroepitaxial or textured growth has been reported on cubic-boron nitride (c-BN), nickel and silicon. C-BN has shown promise as a heteroepitaxial substrate for diamond due to its close lattice match and high surface energy. However, it is presently difficult to grow c-BN in large single crystal form. Recent results report that local epitaxial growth of diamond on nickel is attractive. Nickel has a close lattice match with diamond although its catalytic properties on the decomposition of hydrocarbons into $sp^2$ bonded structures may make it difficult to inhibit the formation of graphite during diamond growth and nucleation. Furthermore, it is difficult to obtain diamond films which adhere well to nickel.

An article by Jeng et al. in Applied Physics Letters, 56 (20) p. 1968, (1990), reported limited texturing of diamond on silicon substrates having a semicrystalline silicon carbide surface conversion film thereon. The lattice match between β-SiC (a=4.36 Å) and diamond (a=3.57 Å) is not extremely attractive; however, β-SiC grows epitaxially on Si despite a 24% lattice mismatch.

In addition to the aforementioned growth techniques, various techniques for patterning and selectively etching diamond films have also been proposed. For example, in an article by S. J. Pearton et al. entitled *ECR Plasma Etching of Chemically Vapour Deposited Diamond Thin Films*, Electronic Letters, Vol. 28, No. 9 (1992), a method of bias-assisted etching of diamond in an oxygen-containing plasma is described. In particular, Pearton et al. propose that relatively high etch rates can be achieved by supplying a relatively high quantity of active oxygen species at relatively high pressures, but that high pressures may also cause the protective mask to be etched at high rates as well, which is disadvantageous.

U.S. Pat. No. 5,160,405 to Miyauchi et al. proposes a method of etching diamond in an oxygen and/or hydrogen containing plasma at a pressure of 0.01 to 5 torr. The plasma is generated by an electron beam which simultaneously irradiates a diamond film and causes a gasification reaction to occur at the surface of the diamond film. The major gasification reaction is an oxidation reaction which produces carbon-dioxide $CO_2$.

An article entitled *ECR Plasma Etching of Natural Type IIa and Synthetic Diamonds,* by C. P. Beetz et al., New Diamond Science and Technology, MRS Int. Conf. Proc., pp. 833–838 (1991), proposes biased enhanced ECR etching of natural and synthetic diamond in an oxygen plasma at pressures as high as 100 mtorr. An article entitled *Etching of Diamond with Argon and Oxygen Ion Beams,* by T. J. Whetten et al., J. Vac. Sci. Tech. A, Vol. 2, No. 2 (1984), pp. 477–480, also discloses a method of reactive ion beam etching of diamond using argon and oxygen ion beams.

Notwithstanding these techniques for synthesizing and processing diamond films, there still exists a need to form high quality diamond films and to develop additional processing techniques to allow the advantageous properties of diamond to be applied to many microelectronic devices and structures.

SUMMARY OF THE INVENTION

With the foregoing background in mind, it is therefore an object of the present invention to provide a method of processing a diamond film by selectively etching the diamond film.

These and other objects, advantages, and features of the present invention are provided by a method for selectively etching a diamond layer or film including steps of forming or patterning a mask layer on the diamond layer leaving exposed diamond surface portions, and then subjecting the masked diamond layer to a hydrogen-containing plasma while the diamond film is negatively biased. Applicants theorize that negatively biasing the diamond film in the hydrogen-containing plasma causes an emission of electrons from the exposed diamond surface portions which, in turn, converts these diamond portions to nondiamond carbon. The hydrogen-containing plasma also continuously removes the nondiamond carbon from the exposed diamond surface portions and maintains the electron emission efficiency of thereof so that further etching can take place.

If no lateral electric field is present, the electrons will be emitted in a direction normal to the surface of the exposed diamond surface portions. Accordingly, substantially anisotropic etching will result with little undercutting of the diamond layer during etching.

The hydrogen-containing plasma is preferably free from oxygen and halogen containing compounds which can adversely damage the diamond film and/or mask layer. In particular, the plasma is preferably a substantially pure hydrogen plasma with only trace amounts of methane or other hydrocarbons. Typical mask layers which are resistant to the hydrogen-containing plasma preferably include one or more layers formed of a material selected from the group consisting of gold, platinum, refractory metals and alloys thereof. Other suitable mask layers may include materials resistant to the plasma environment.

In one embodiment, the method further includes the step of positioning the masked diamond layer within a microwave or radio frequency plasma processing chamber so that microwave or radio frequency energy generates the hydrogen-containing plasma from the feed gas. In this embodiment, the negative biasing is preferably performed by delivering a signal through a suitable substrate holder to the diamond layer. The negative bias signal is preferably a signal having at least a portion thereof at an absolute value of greater than about 100 volts. In other words, the negative bias signal may be DC, pulsed DC or even AC as long as a portion of the waveform of the signal negatively biases the diamond layer. The microwave plasma embodiment is also preferably carried out at a pressure in a range of about 10 to 25 torr and at a temperature in a range of about 400° to 600° C. within the plasma processing chamber.

Another embodiment of the invention is performed using a DC plasma reactor or processing chamber. Accordingly, this embodiment of the invention includes the step of positioning the masked diamond layer within the plasma processing chamber. Moreover, the negative biasing of the diamond layer is at a sufficient voltage to cause electron emission from the exposed diamond surface portions and also to generate the hydrogen-containing plasma within the plasma processing chamber. The voltage may be a signal with at least a portion thereof at an absolute value of greater than about 400 volts, and more preferably above 800 volts, while the preferred pressure is in a range of about 200 mtorr to 3 torr. The temperature is preferably in a range of about 100° to 600° C. within the plasma processing chamber. The electrode current is preferably 100 to 800 milliamps and with an electrode spacing of 0.25 to 7 inches.

XPS-EELS, respectively, taken at various bias times corresponding to Example 3.

Figure 9:
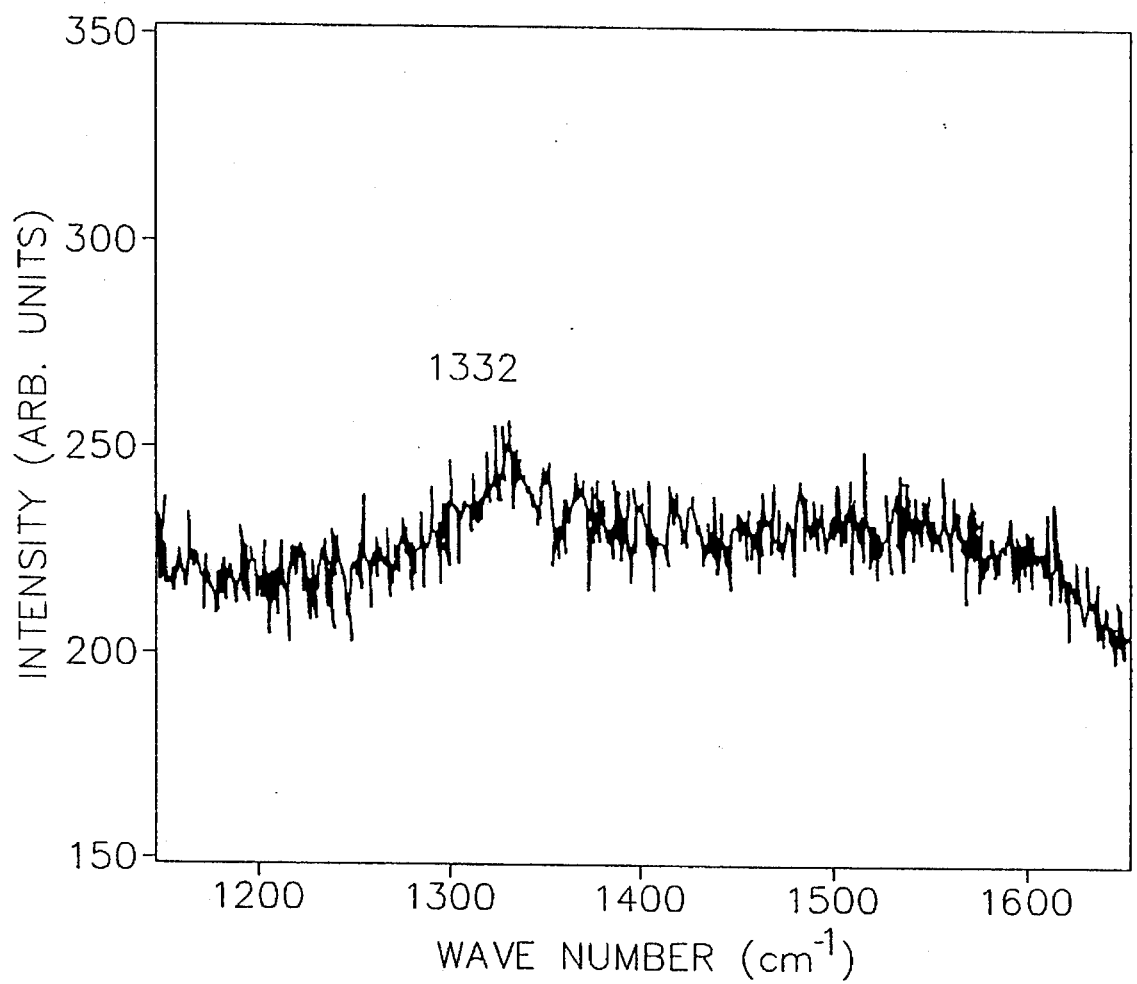

FIG. 9 is a Raman spectra from a sample after 2 hours of bias pretreatment corresponding to Example 3.

Figure 10A:
Figure 10B:
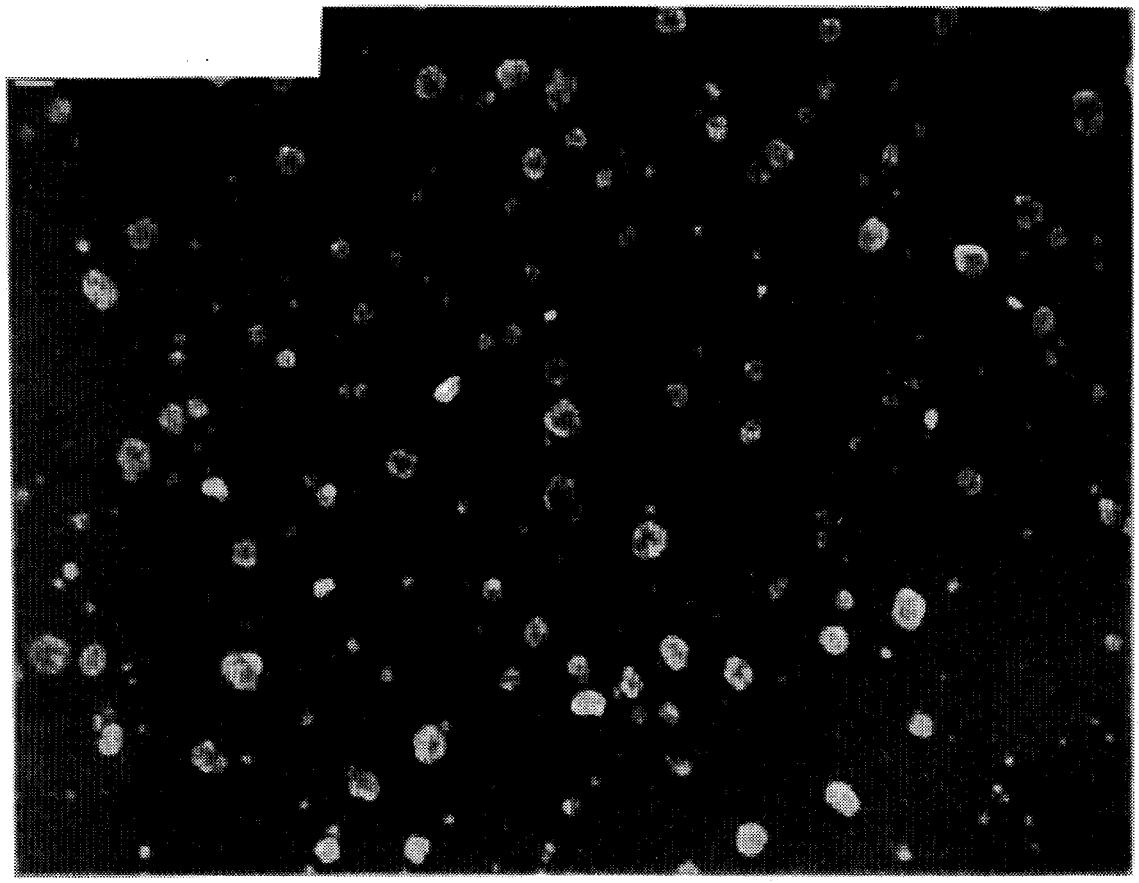
Figure 10C:
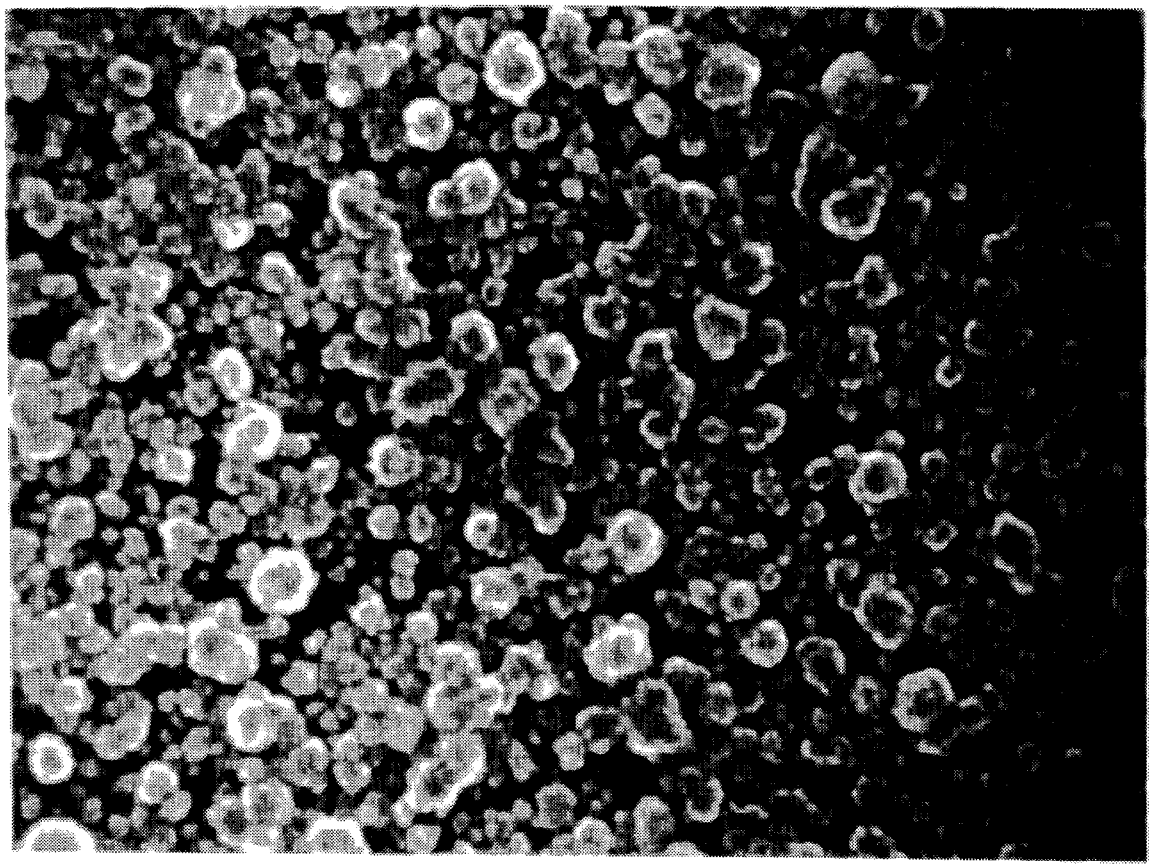

FIGS. 10A, 10B and 10C are SEM photographs of a sample after a bias pretreatment after 1 hour, 1.5 hours, and 2 hours, respectively, corresponding to Example 3.

Figure 11:
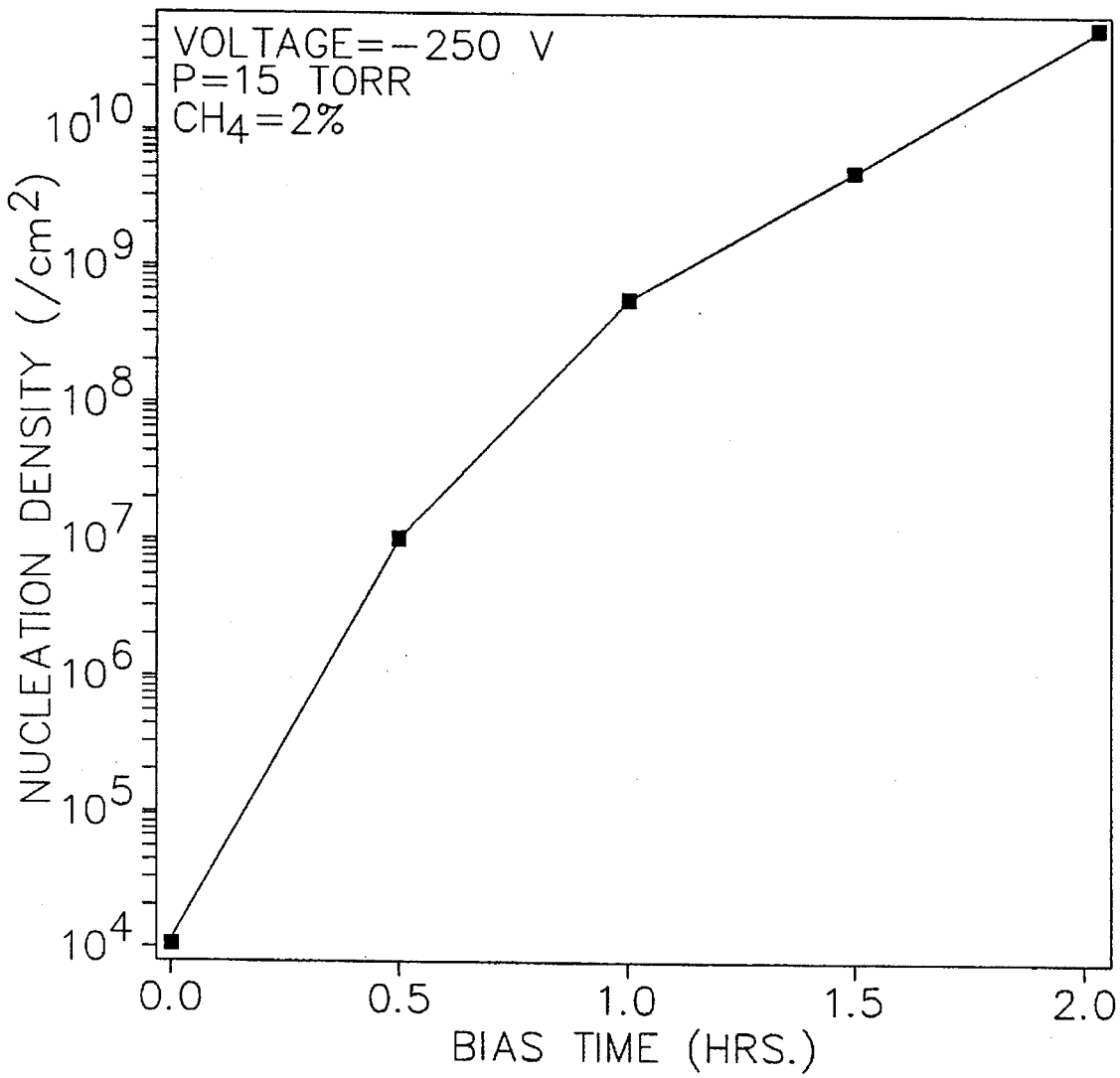

FIG. 11 is a graph of nucleation density as a function of bias pretreatment time corresponding to Example 3.

Figure 12A:
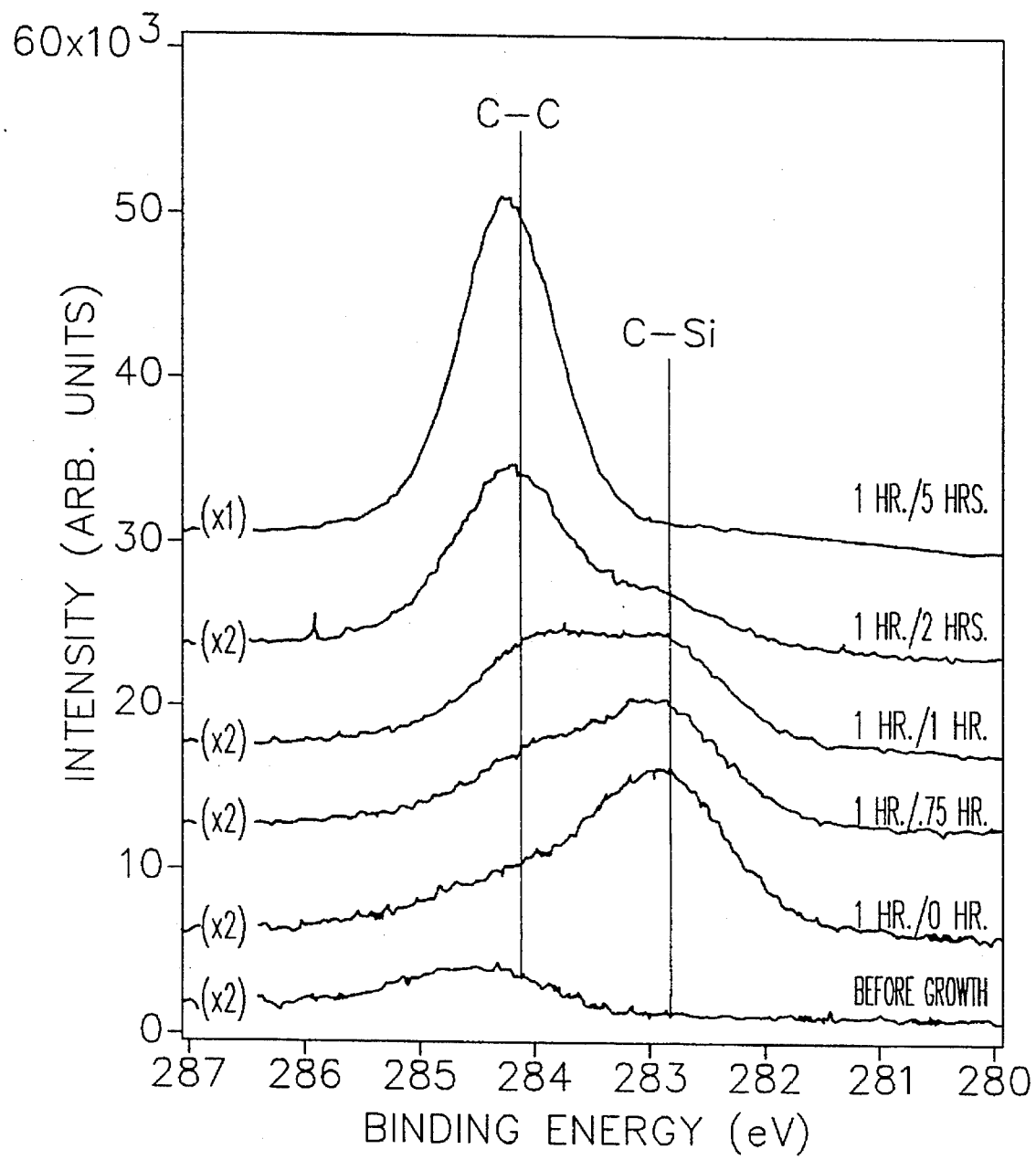
Figure 12B:
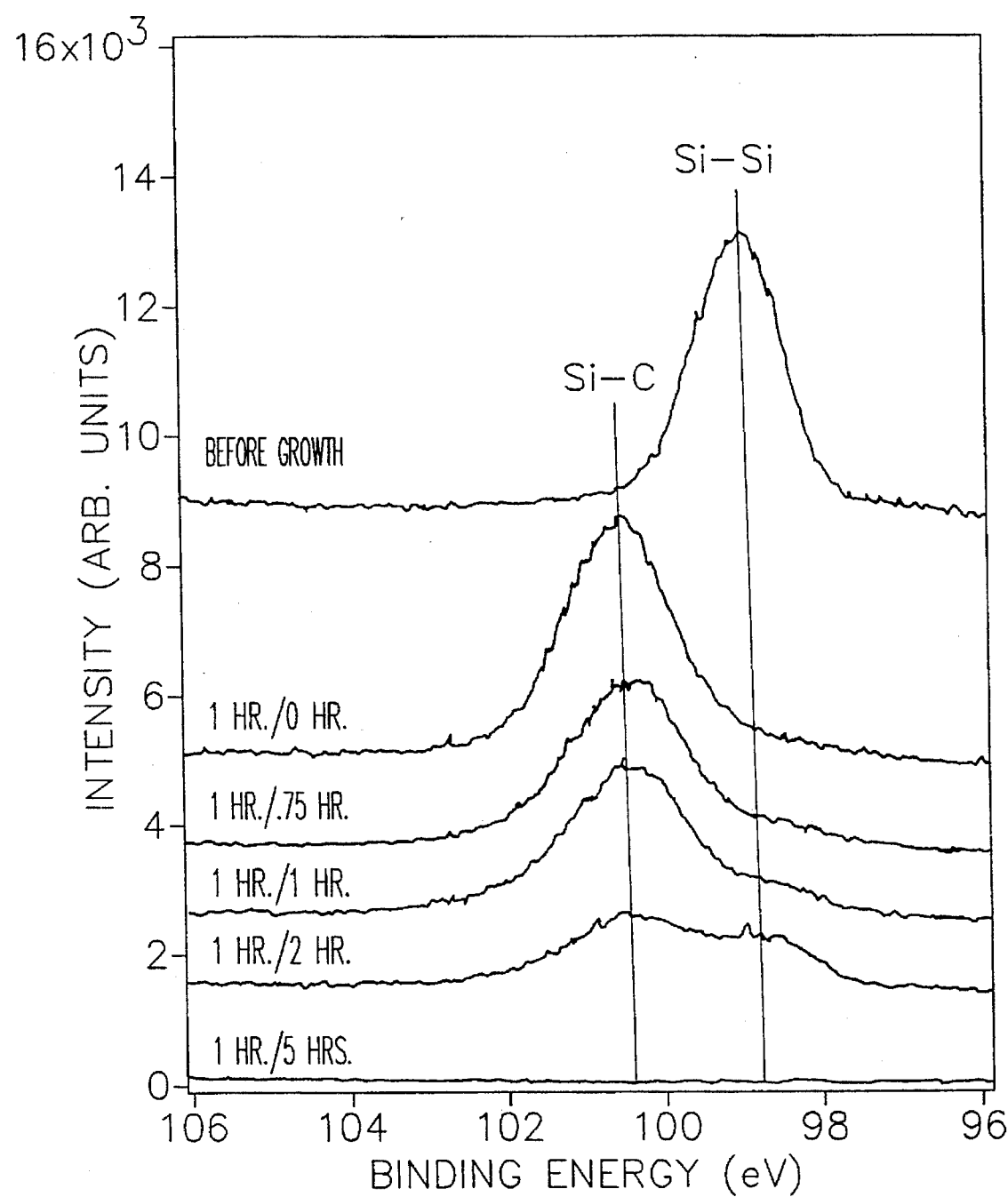

FIGS. 12A and 12B are XPS at various times for C-ls and Si-2p peak progressions, respectively, corresponding to Example 4.

Figure 13A:
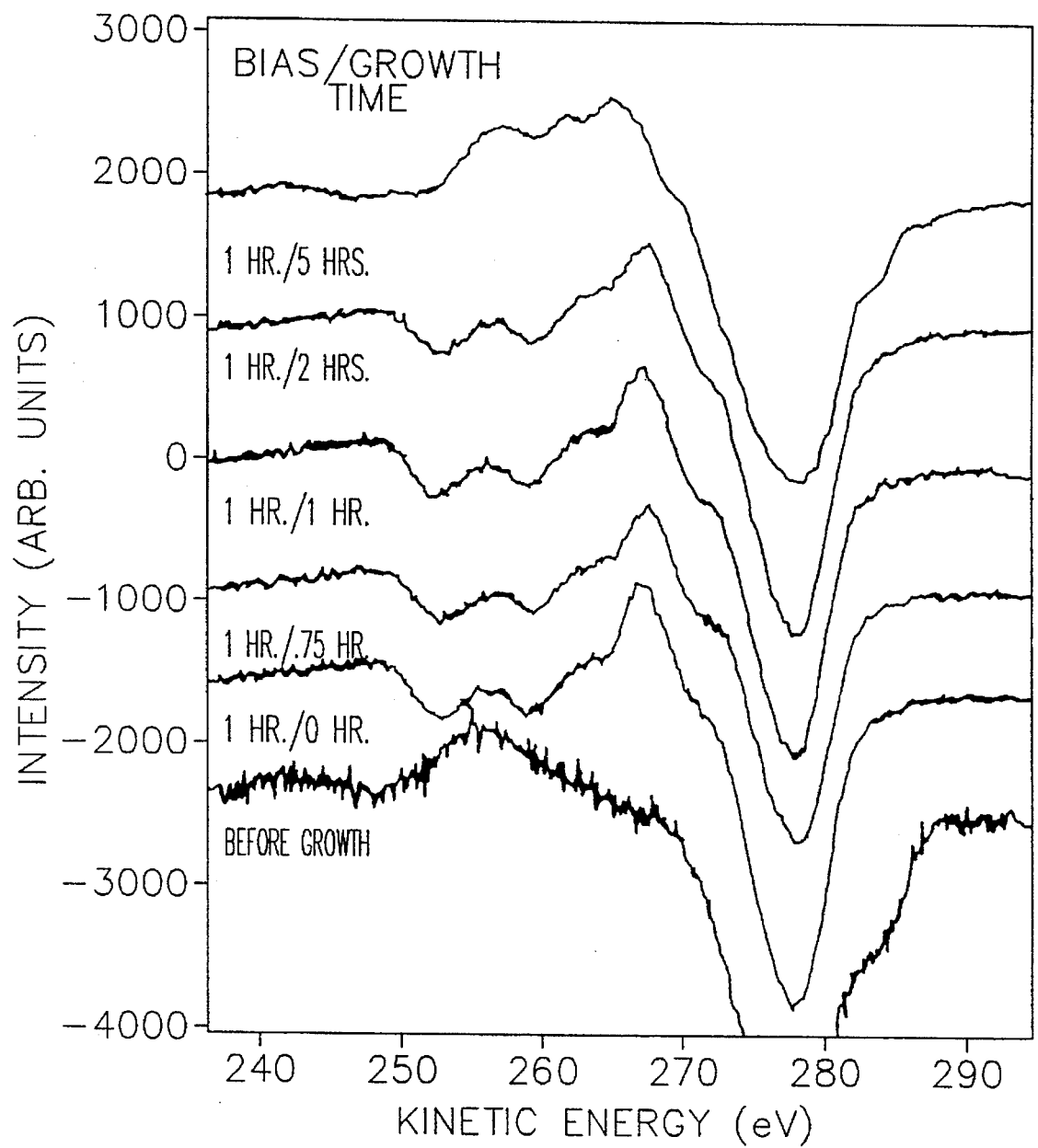
Figure 13B:
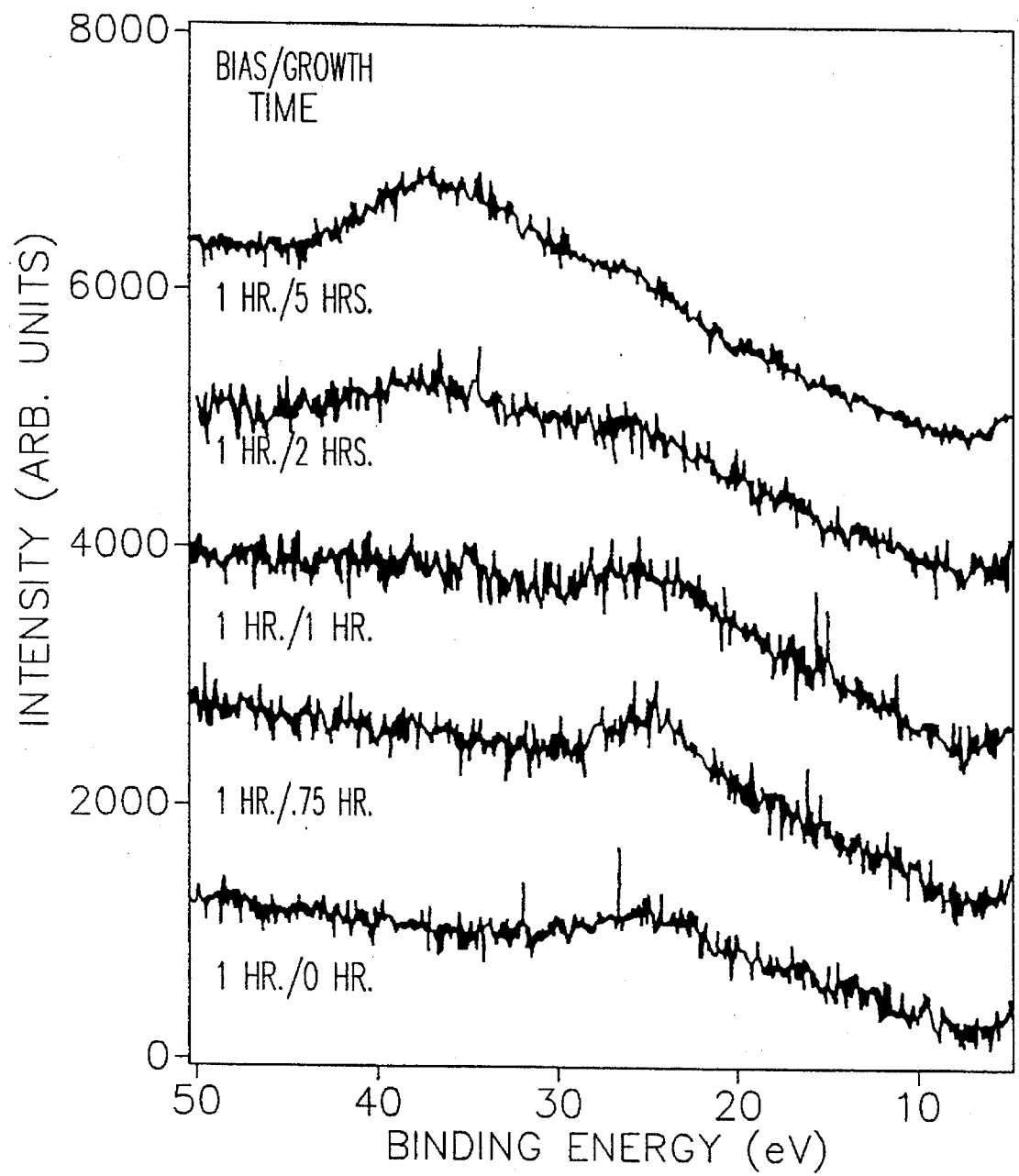

FIGS. 13A and 13B are auger electron spectra and XPS-EELS, respectively, taken at various diamond growth times on a sample pretreated for 1 hour, corresponding to Example 4.

Figure 14A:
Figure 14B:
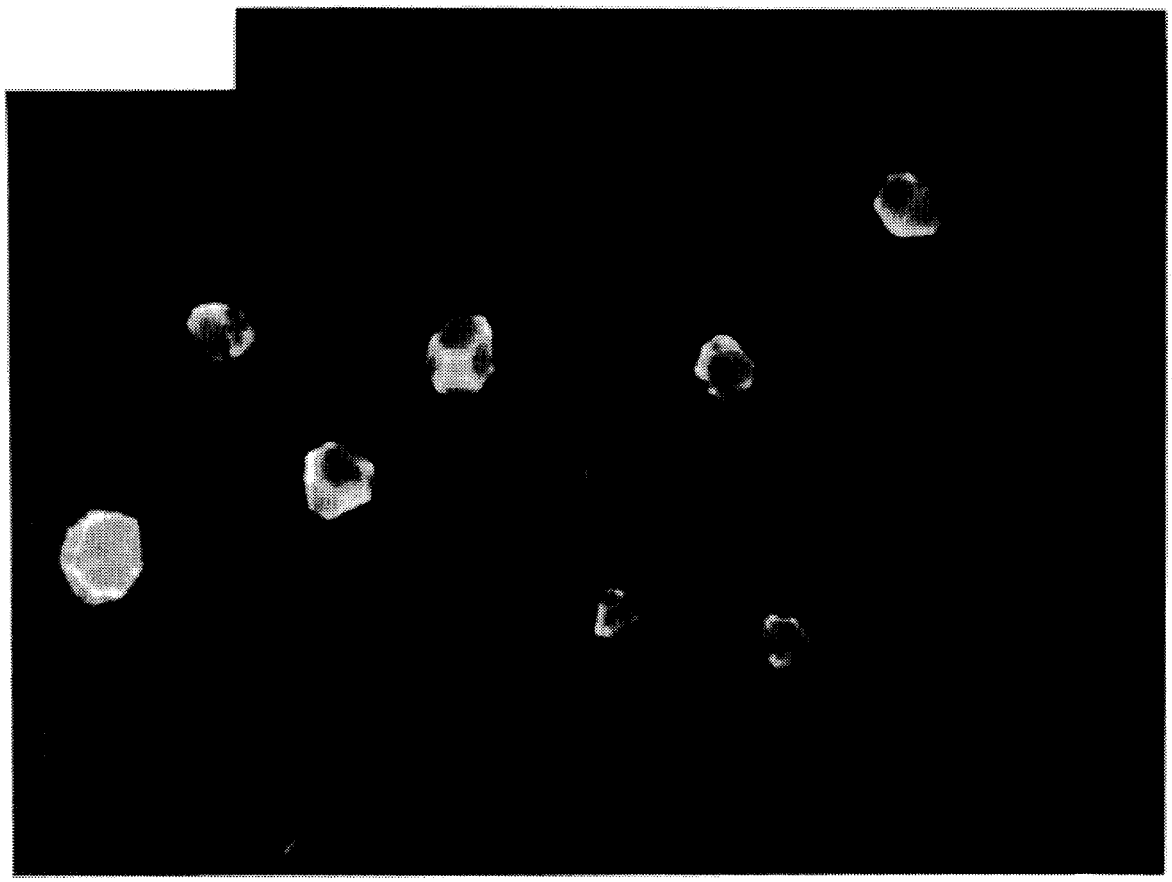

FIGS. 14A and 14B are SEM photographs showing a sample after 1 hour bias only and 1 hour growth after a 1 hour bias, respectively, corresponding to Example 4.

Figure 15:
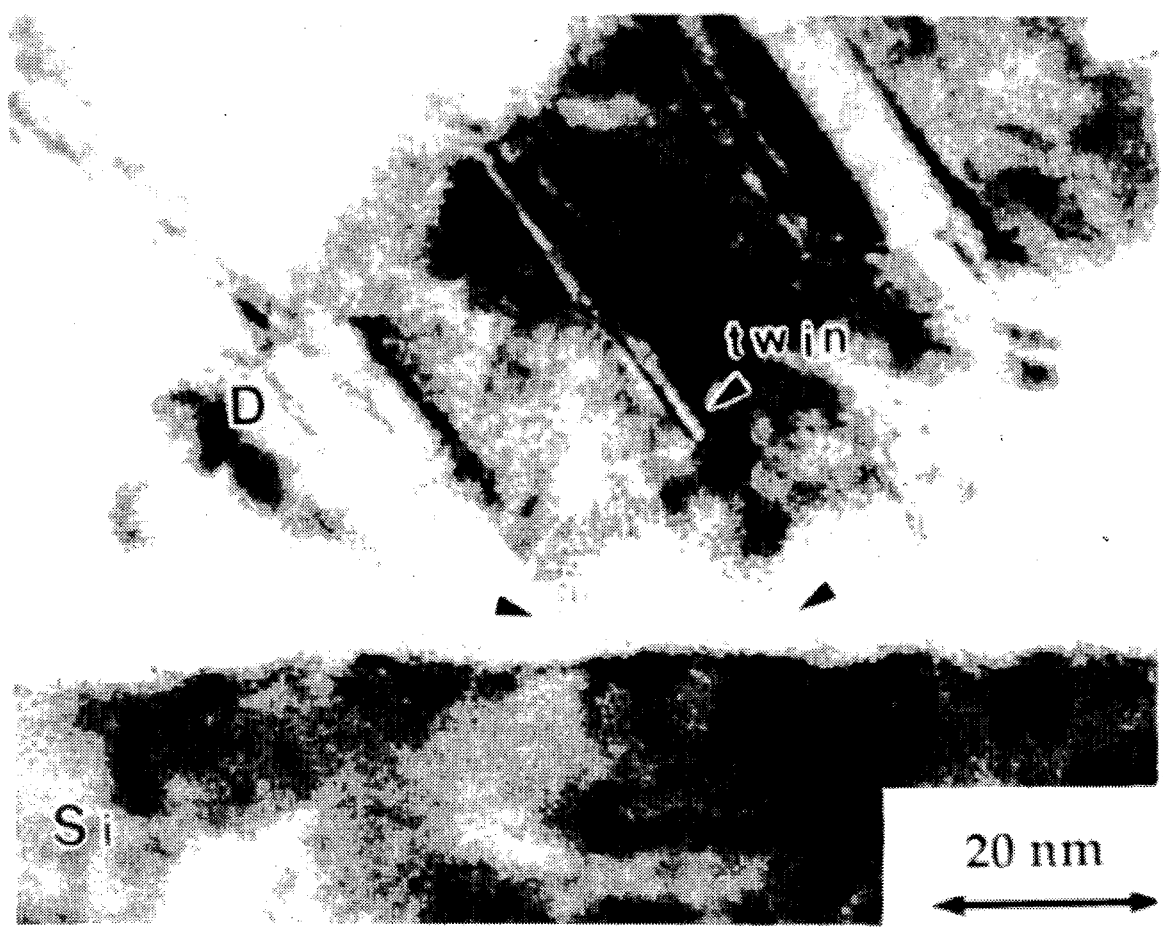

FIG. 15 is a low magnification high resolution XTEM of an interfacial film between silicon and diamond corresponding to Example 5.

Figure 16:
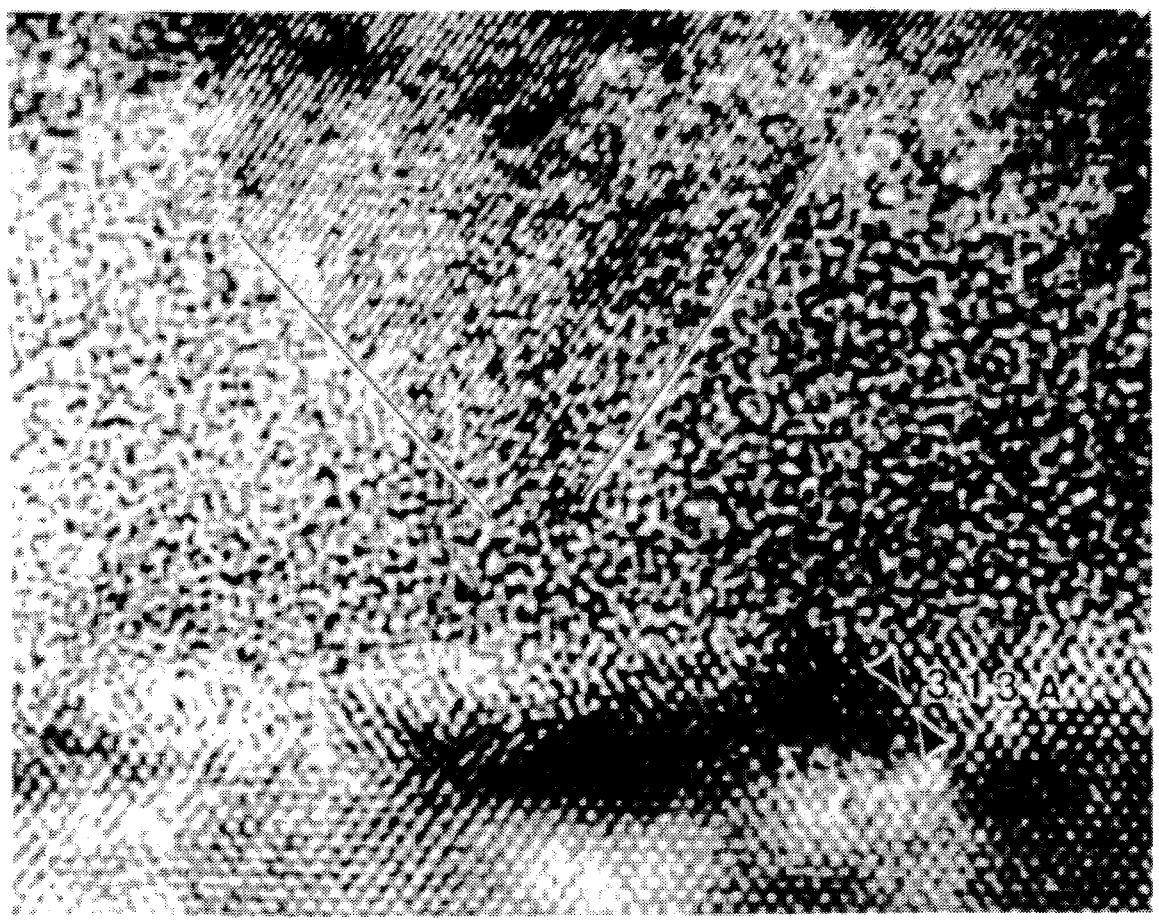

FIG. 16 is an high magnification high resolution XTEM of an amorphous interfacial film between silicon and diamond corresponding to Example 5.

Figure 17:
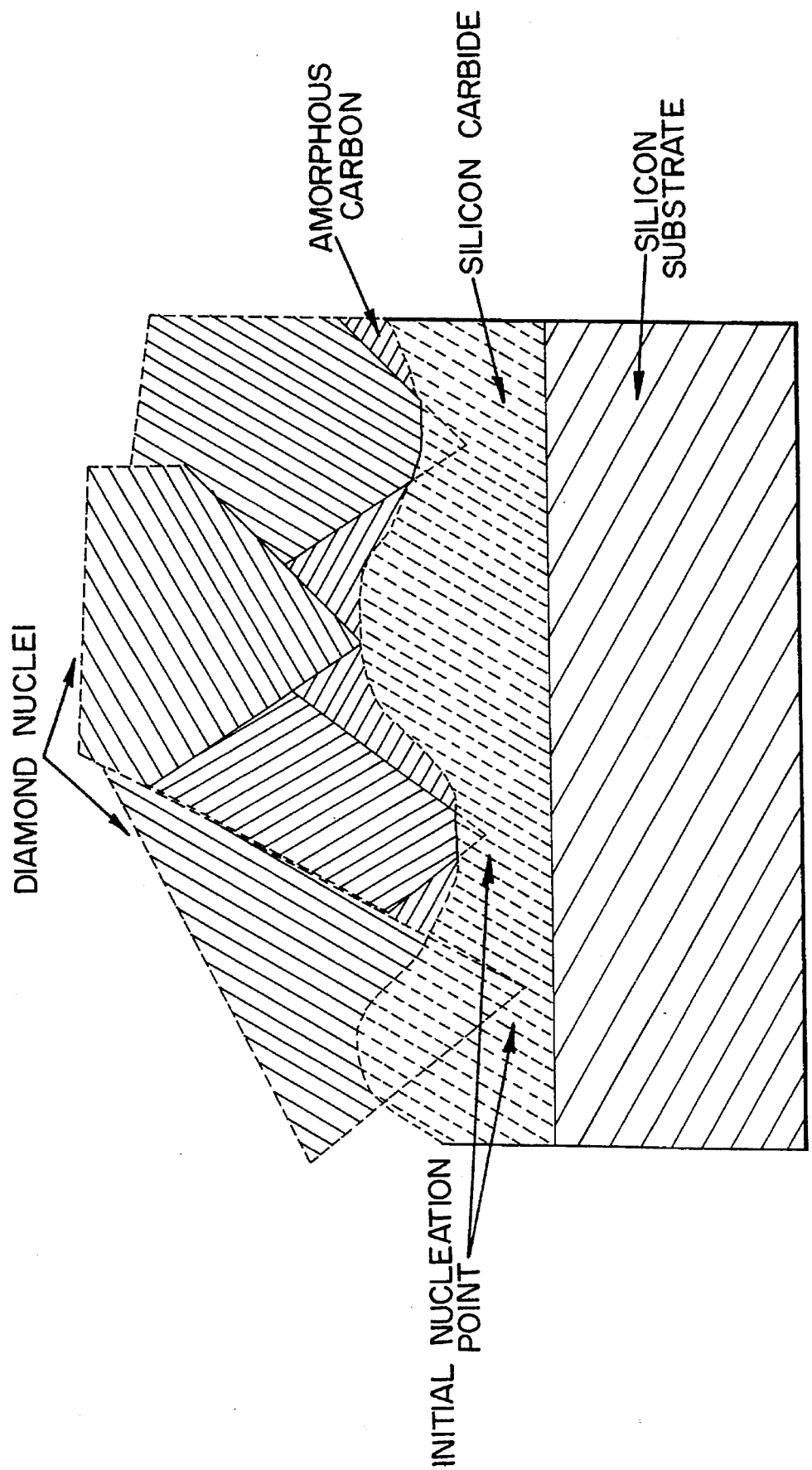

FIG. 17 is a schematic diagram of a model of diamond nuclei corresponding to Example 5.

FIGS. 18A–18F show various stages in a model of diamond nucleation corresponding to Example 5.

Figure 19A:
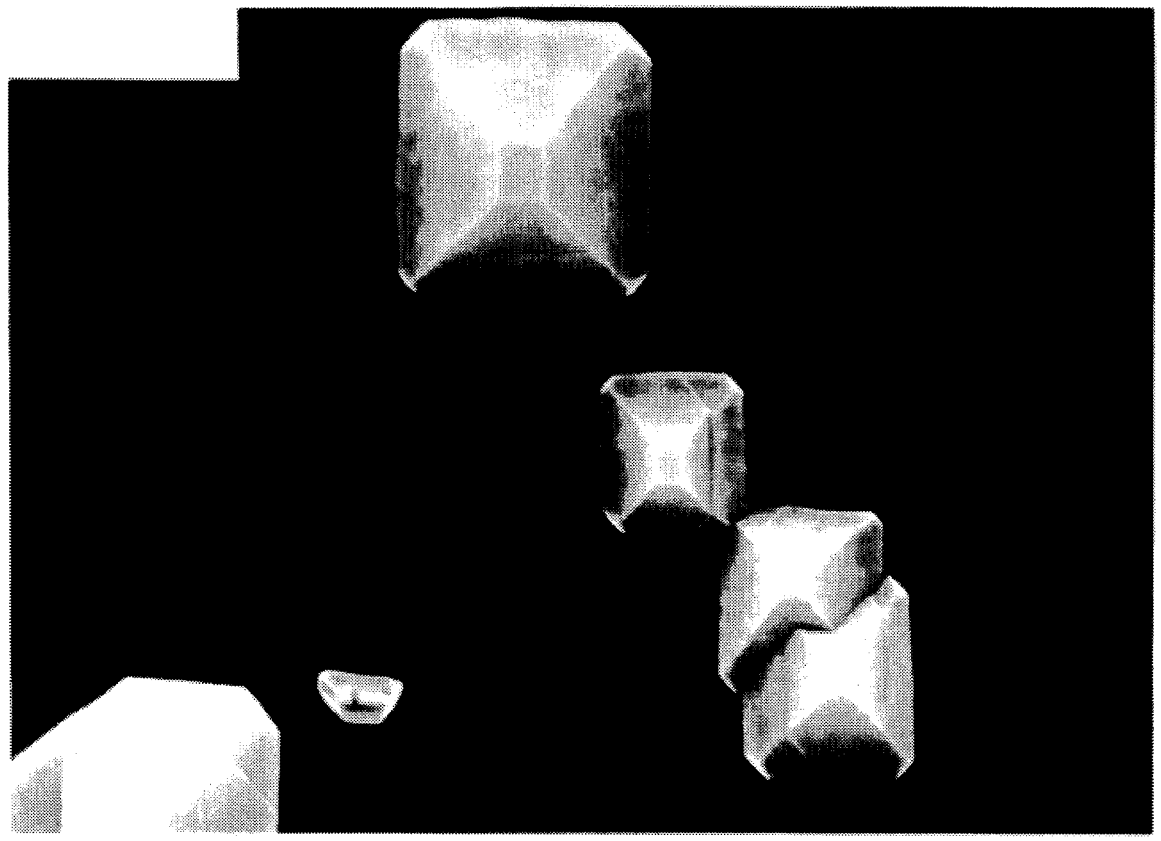
Figure 19B:
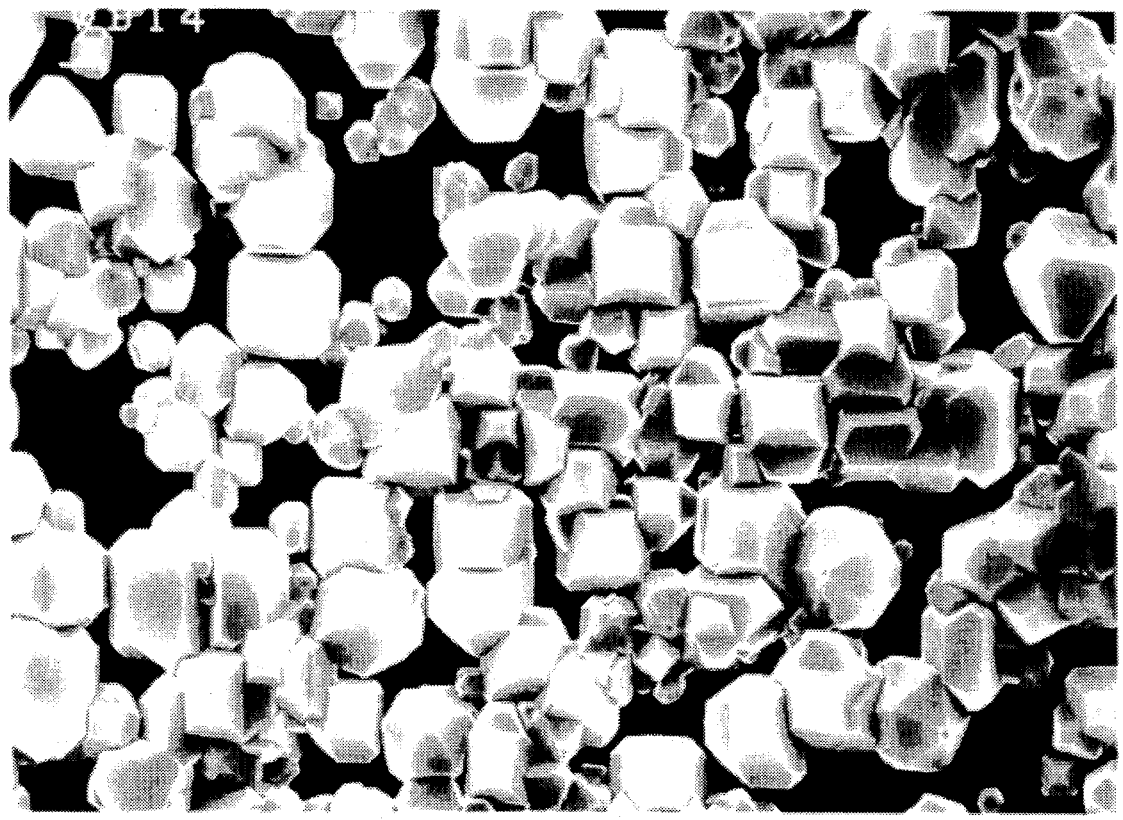
Figure 19C:

FIGS. 19A–19C are SEM photographs of the textured diamond film at the center, region between the center and the edge, and edge region, respectively, corresponding to Example 6.

Figure 20:
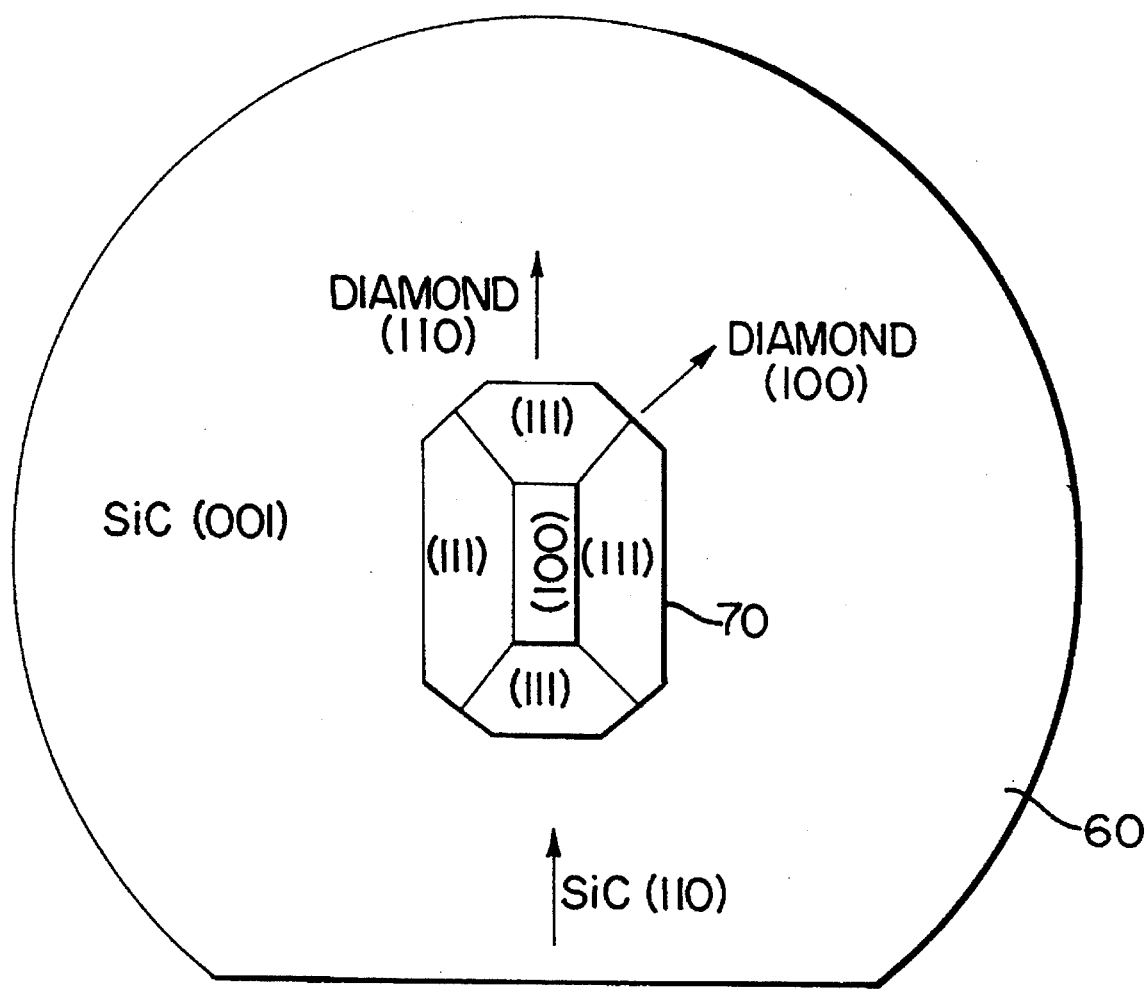

FIG. 20 is a schematic representation of the diamond particle orientation relative to the SiC substrate corresponding to Example 6.

Figure 21:
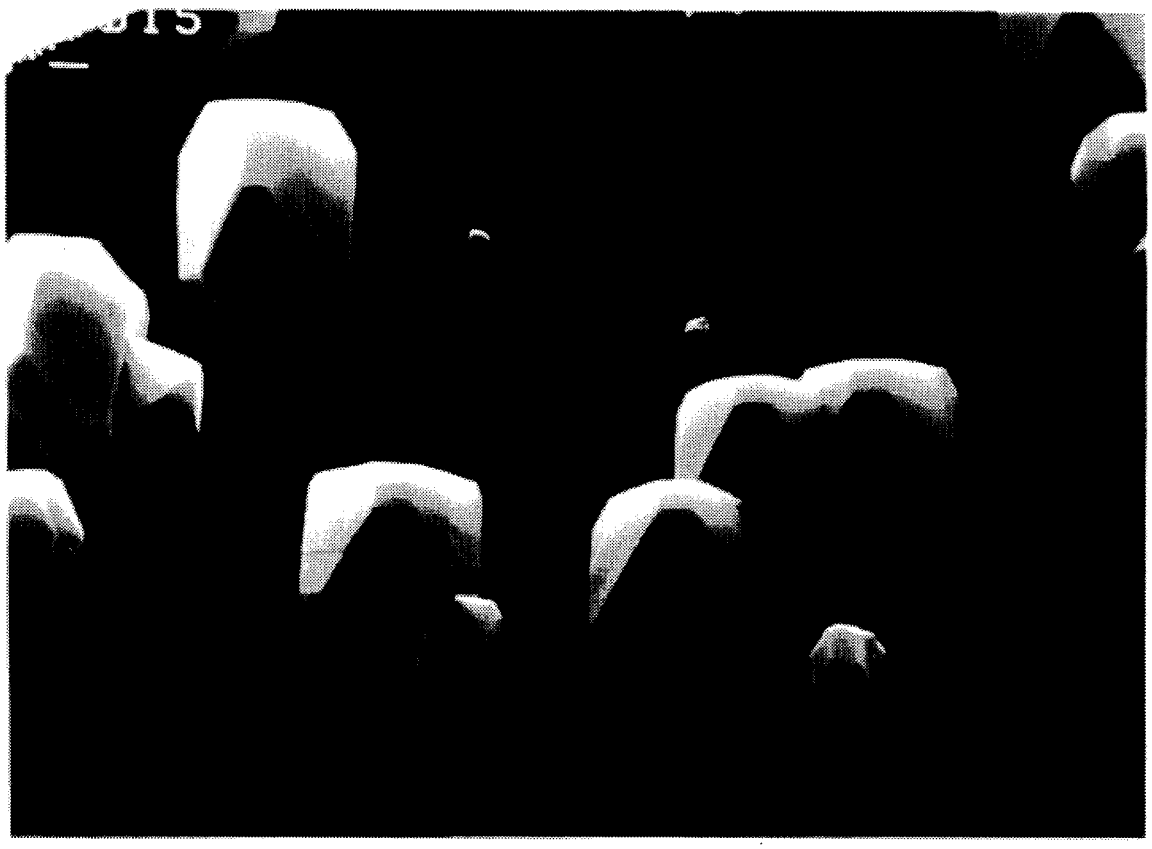

FIGS. 21 is an SEM photograph of the center region taken at a 45° tilt to show (111) faceting corresponding to Example 6.

Figure 22:
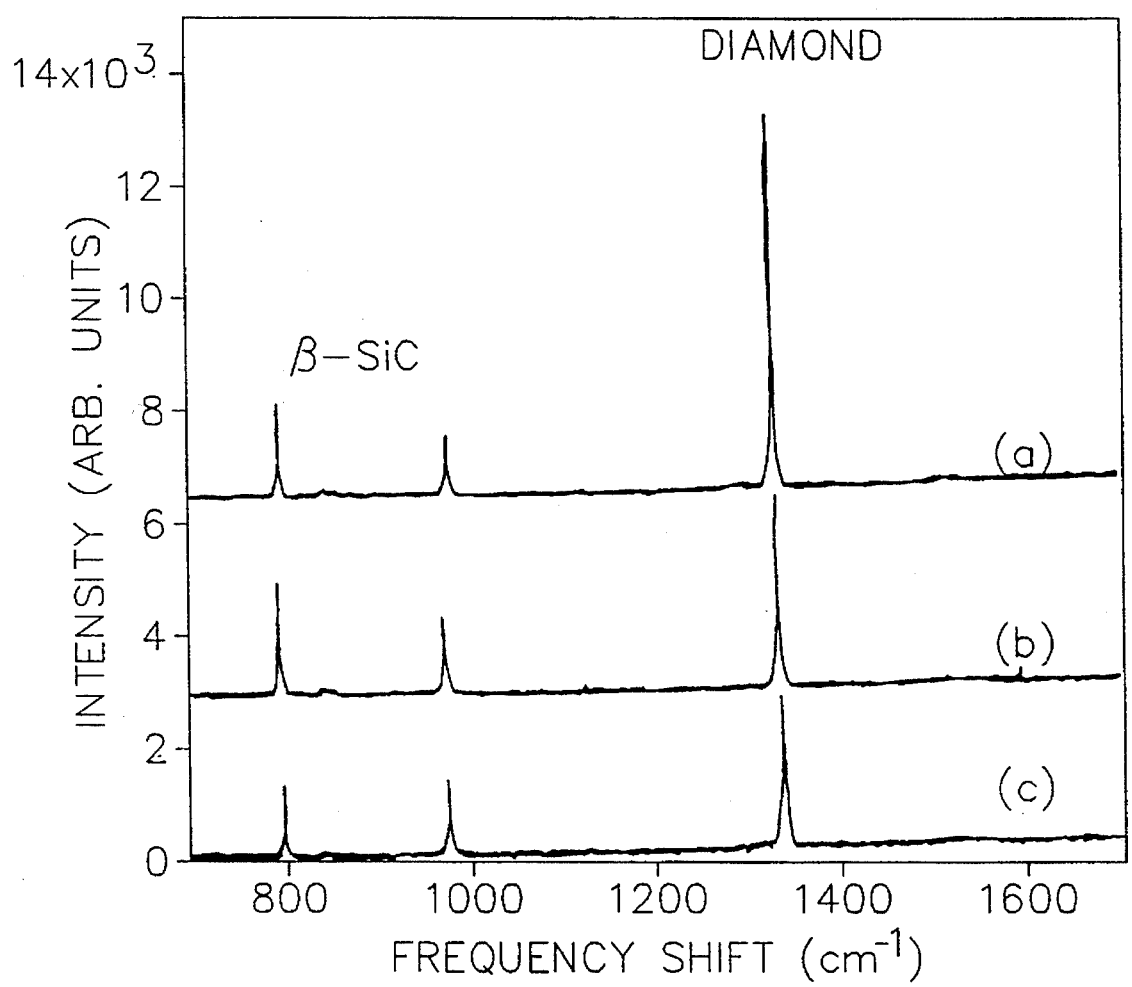

FIG. 22 is a Micro-Raman spectra taken from a SiC sample corresponding to Example 6.

Figure 23:
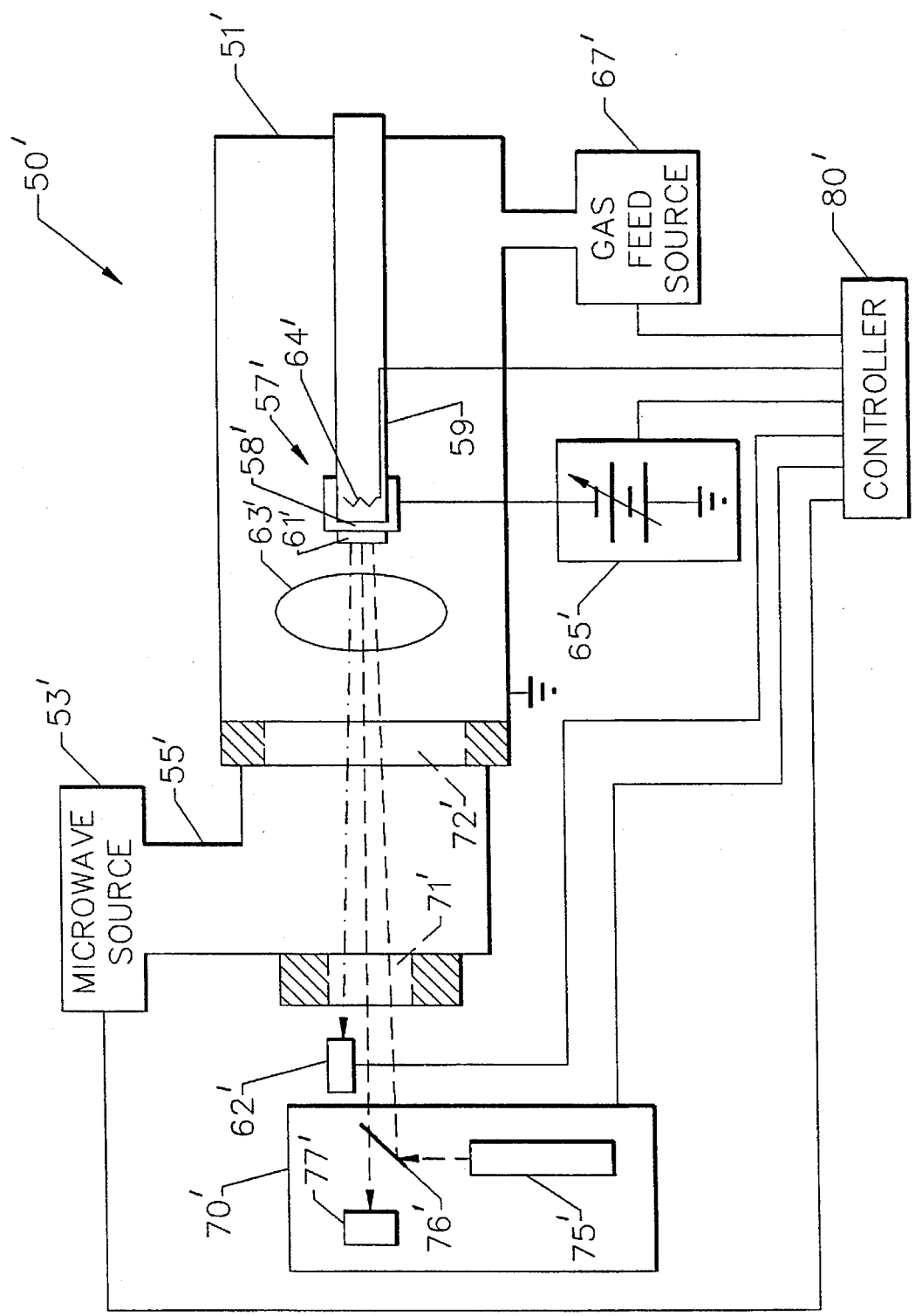

FIG. 23 is a schematic diagram of an apparatus for selectively etching a diamond film according to the present invention.

Figure 24A:
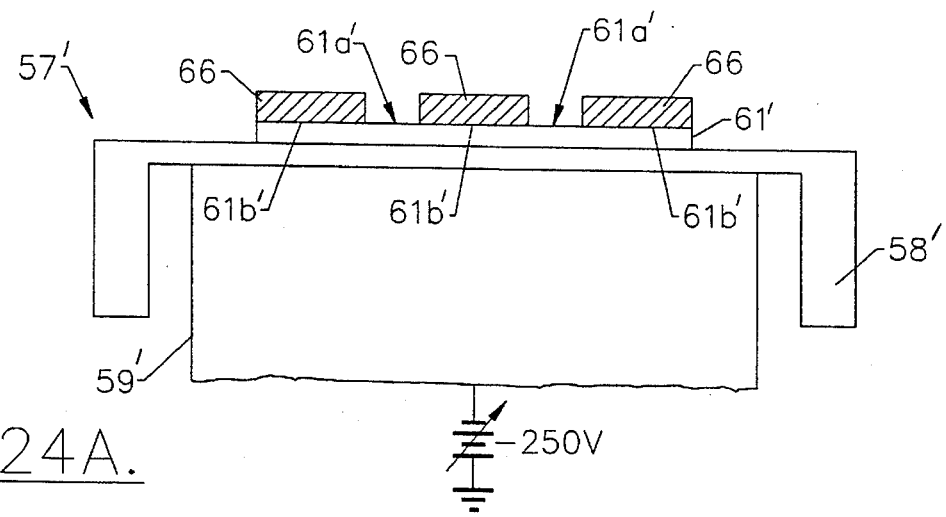

FIG. 24A is a greatly enlarged schematic cross-sectional view of a portion of the substrate holder, diamond film, and plasma as shown in FIG. 23.

Figure 24B:
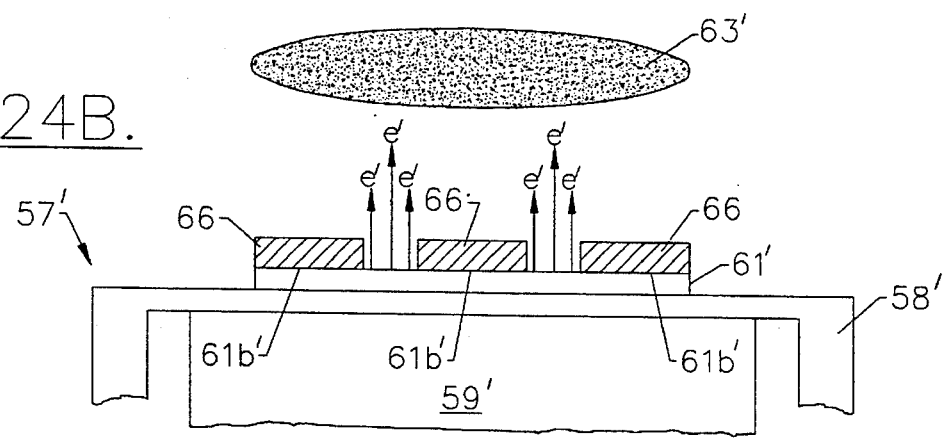
Figure 24C:
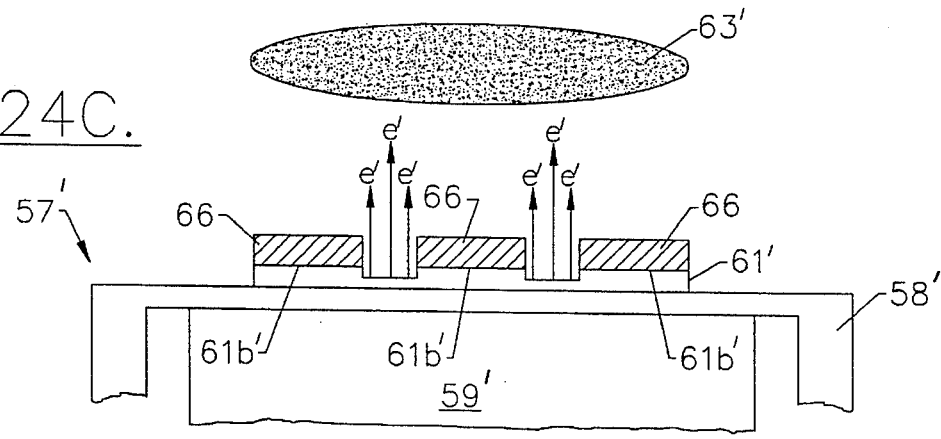
Figure 24D:
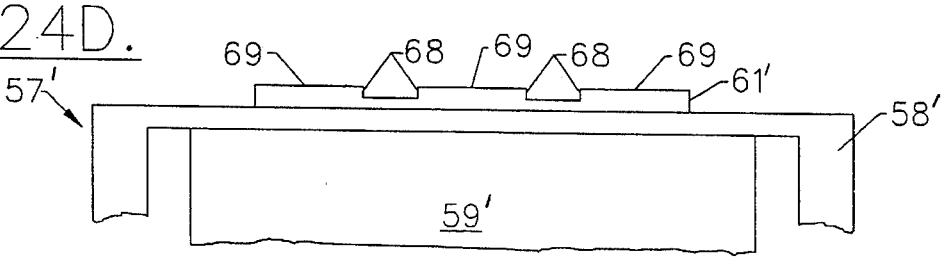

FIGS. 24B–D are schematic cross-sectional side views of a diamond film during intermediate processing steps for selectively etching the diamond film according to the invention and using the apparatus shown in FIG. 23.

Figure 25:
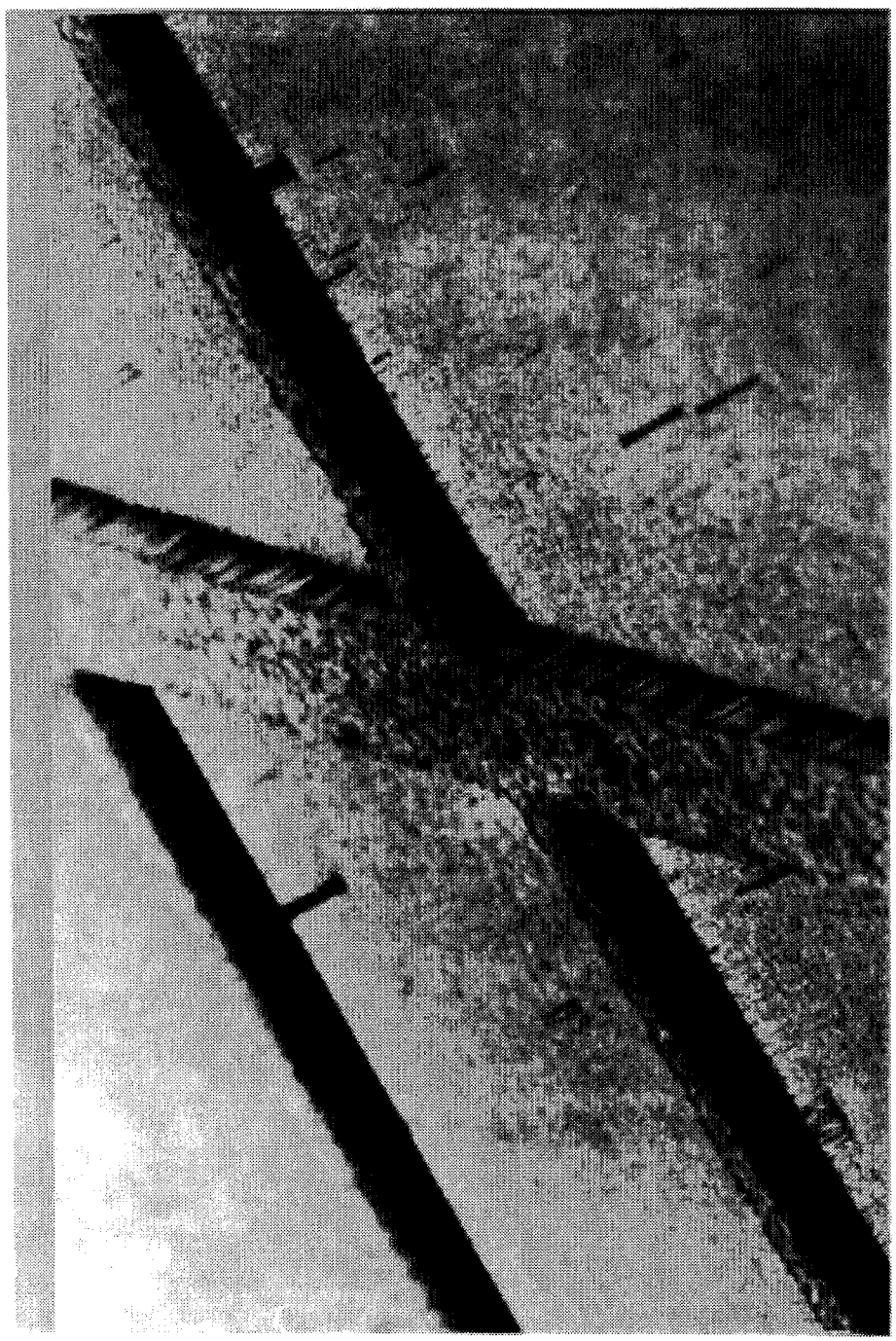

FIG. 25 is an SEM micrograph of an diamond film which has been anisotropically selectively etched in a microwave plasma, according to the present invention.

Figure 26:
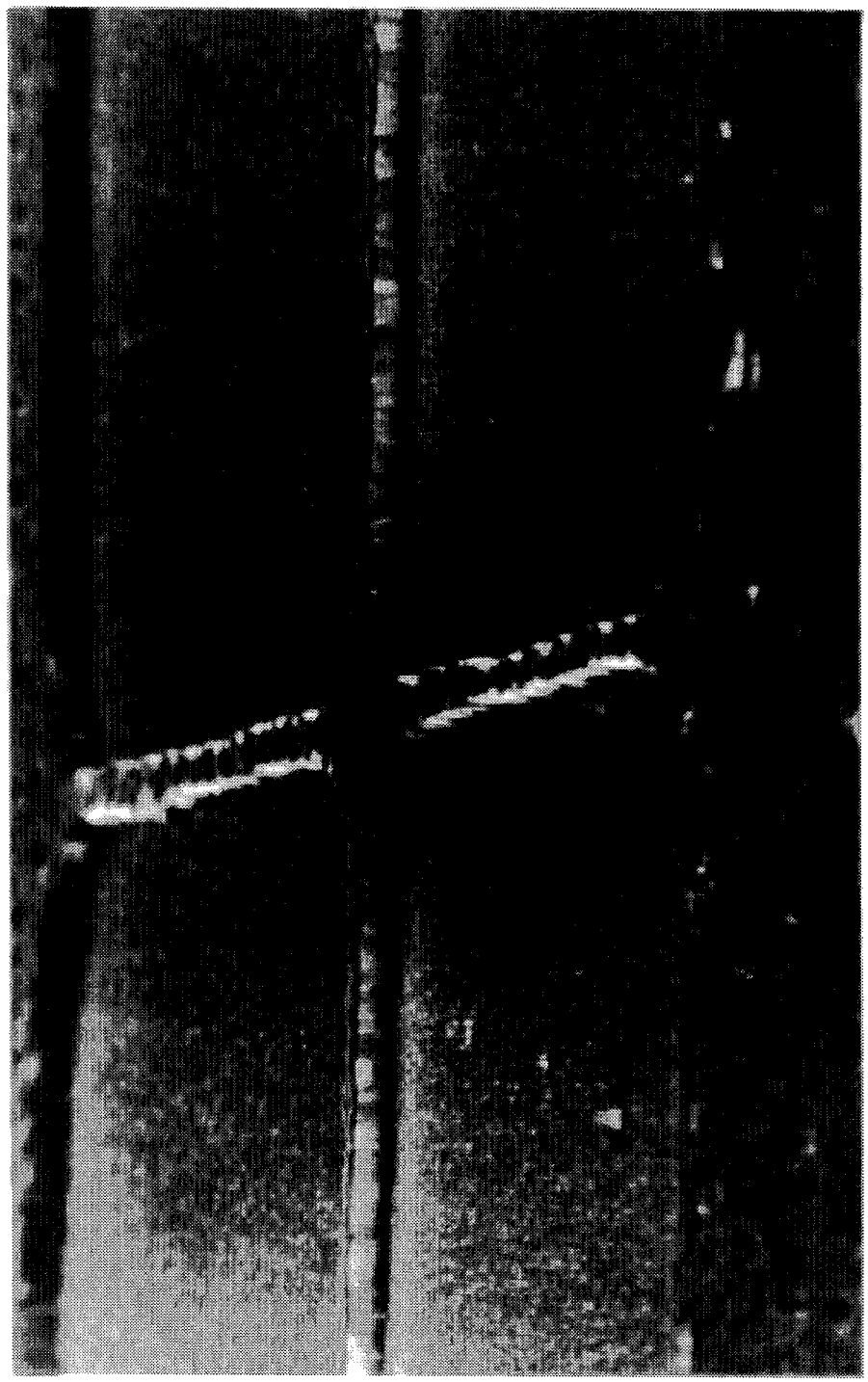

FIG. 26 is an SEM micrograph of an diamond film which has been anisotropically selectively etched to have line widths less than 2 μm, according to the present invention.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, applicants provide these embodiments so that this disclosure will be thorough and complete, and will fully convey the scope of the invention to those skilled in the art. Like numbers refer to like elements throughout and prime notation is used to indicate similar elements of alternate embodiments. The thickness of films and regions are exaggerated for clarity.

The method for selectively etching of diamond according to the present invention is better understood with reference to a related diamond growth technique also using bias assisted nucleation of diamond to form a high quality diamond film. This nucleation and growth technique is described in the parent patent application, Ser. No. 07/937,481 filed Aug. 28, 1992, the entire disclosure of which is incorporated herein by reference. Accordingly, the following description first describes these diamond nucleation and growth techniques, and later describes the diamond etching aspects of the present invention.

Figure 1A:
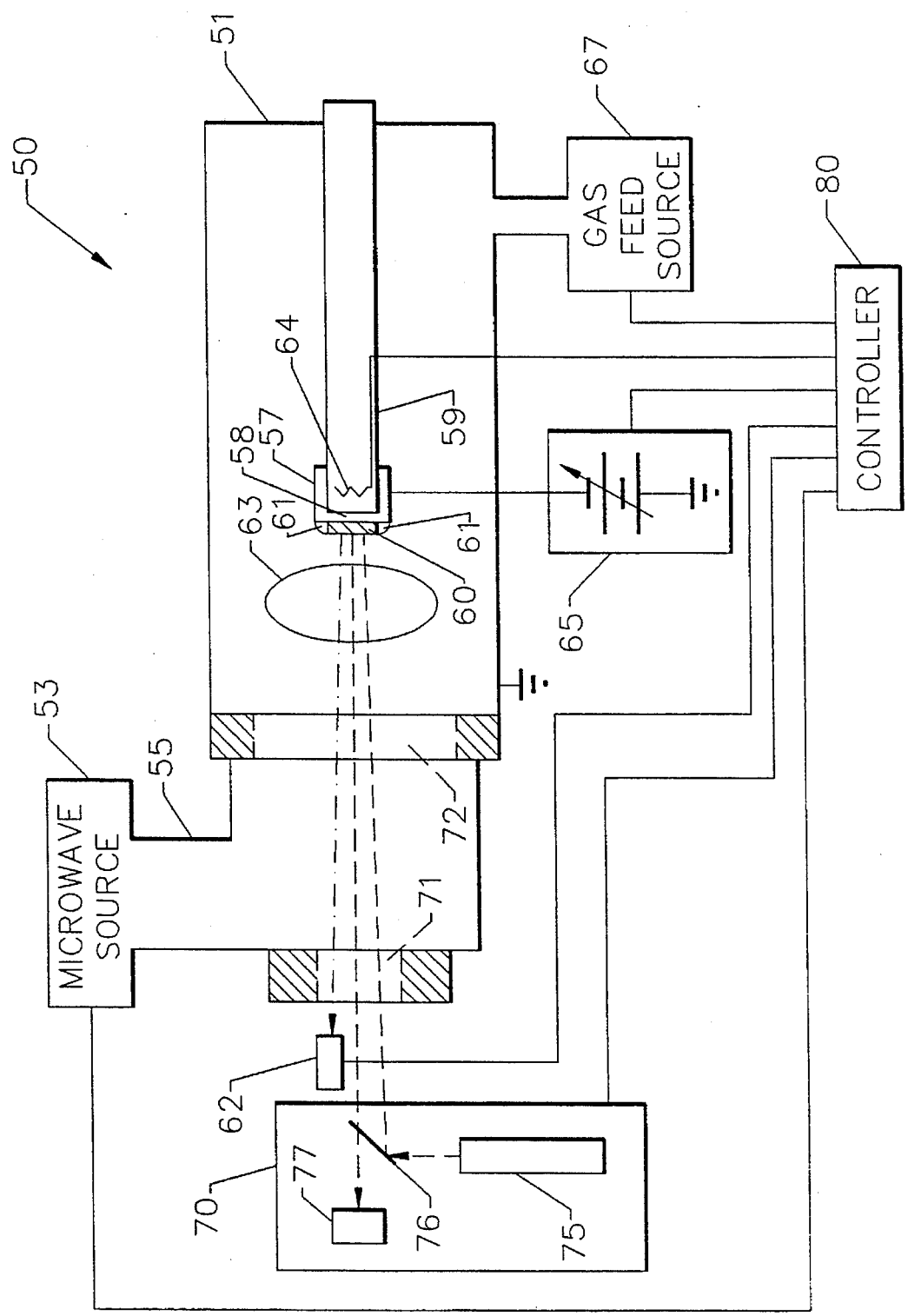
FIG. 1A is a schematic diagram of the apparatus according to the present invention.

A schematic representation of the CVD apparatus according to the present invention is generally designated as 50 in FIG. 1A. The CVD apparatus 50 preferably includes a conventional CVD reactor 51, such as an ASTeX microwave plasma CVD reactor available from ASTeX Company of Woburn, Mass.

The apparatus 50 has a controllable microwave power source 53 coupled to the reactor 51 by a rectangular waveguide section 55 to generate a plasma 63 within the reactor for microwave plasma enhanced CVD. The microwave power source 53 may be an ASTeX S-1000, 2.45 GHz microwave supply. The reactor 51 further includes a retractable substrate holder 57 positioned therein. A substrate 60 to be processed is positioned on the substrate holder 57 and a heater 64 (e.g., a tantalum heater) associated with the substrate holder is used to control the substrate temperature independent of the plasma power. The temperature of the substrate 60 may be measured by a conventional optical pyrometer 62.

The plasma 63 forms at a stable position in a medial portion of the reactor 51. The substrate 60 position relative to the plasma 63 may be varied between 0 (immersed in the plasma) and 8 centimeters by moving the retractable substrate holder 57 with respect to the reactor 51. The substrate holder 57 is connected to a controllable DC power supply 65 in the illustrated embodiment to electrically bias the substrate holder 57 with respect to ground. Alternately, the substrate holder may be isolated from ground so that it is at a floating electrical potential, or the substrate holder may be connected to ground, such as during growth of diamond on the pretreated substrate. Other electrical bias power supplies may be used in addition to the illustrated DC power supply 65 which provides a pure DC bias. For example, a conventional pulsed-DC power supply, AC (60 Hz) power supply, or RF power supply may also be used to bias the substrate holder 57.

A conventional gas feed source 67, including a vacuum pump and/or other conventional process pumps, are connected to the reactor 51. The gas feed source 67 controls the pressure within reactor 51 and the gas flow rate, as well as the mixture of feed gasses.

According to another aspect of the invention, a laser reflection interferometer 70 may be positioned outside of the reactor 51 so that a laser beam may be directed through a pair of spaced apart view ports 71, 72 to the surface of the substrate 60, reflected from the substrate, and back to the interferometer 70. The laser reflection interferometer 70, as would be readily understood by those skilled in the art, includes a laser 75, a beam directing prism 76, and an optical detector 77. The laser may be a helium-neon laser with a wavelength of 630 nanometers. The laser reflection interferometer 70 is coupled to a controller 80, such as a computer or microprocessor, operating under stored program control. The laser reflection interferometer 70 may be used in-situ to monitor the growth of a diamond film on the substrate 60 after the substrate has been pretreated to achieve high diamond nucleation density. For example, the quality of the diamond film may be determined by the intensity of the reflected beam. As would be readily understood by those skilled in the art, both surface roughness and clarity are indications of the quality of the diamond film.

The rate of growth of diamond may also be readily monitored by the apparatus 50 as would be readily understood by those skilled in the art. The controller 80 may be coupled to other controllable components of the apparatus 50 so that real time corrections may be made to the processing parameters during the growth of the diamond film.

Referring now to the greatly enlarged view of a portion of the substrate holder 57 as shown FIG. 1B, another aspect of the present invention will now be explained. The substrate holder 57 includes a substrate holding platform 58, such as a molybdenum cap, secured to the end of a tubular body 59, as would be readily understood by those skilled in the art. According to the invention, the substrate platform 58 includes a diamond film 61 on a predetermined portion thereof. As illustrated, the diamond film 61 preferably includes an opening extending vertically therethrough having a circular cross-sectional shape to receive therein a conventional circular substrate 60. Thus, the diamond film 61 is in the form of a ring that is laterally adjacent and laterally surrounds the substrate 60. Accordingly, both the diamond film 61 and the substrate 60 may be readily exposed to the plasma 63.

The diamond film 61 may also coat the entire substrate platform 58. In other words, the diamond film may also extend along the surface of the substrate platform 58 beneath the substrate 60. Other positions for the diamond film are also possible as long as the diamond film is connected to the bias power supply 65 and is exposed to the plasma 63. Exposed to the plasma 63 means that the diamond film 61 and the substrate 60 are immersed in the plasma glow region, or more typically, positioned contiguous with the plasma sheath region which in turn is below the plasma glow region.

Figure 1B:
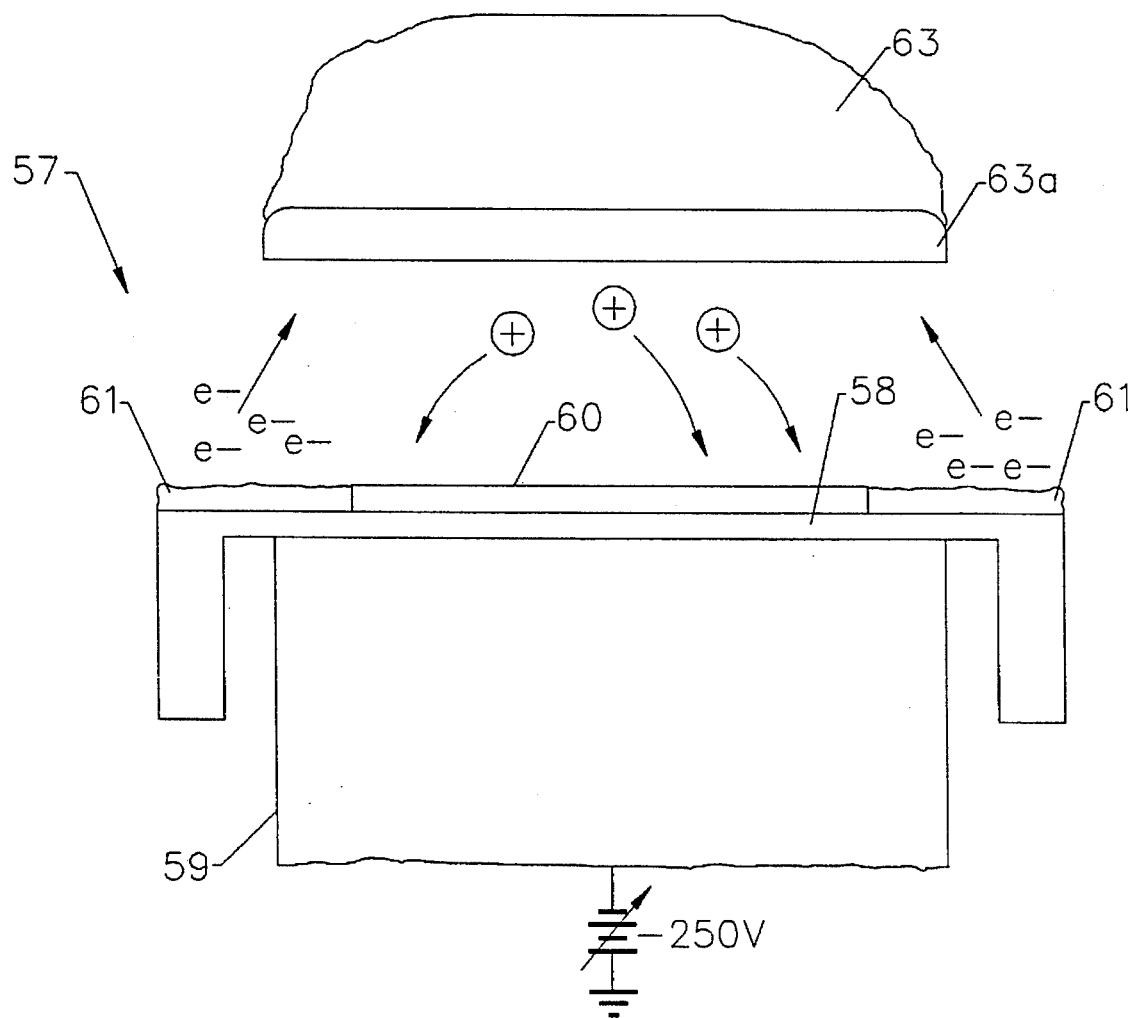
FIG. 1B is a greatly enlarged schematic cross-sectional view of a portion of the substrate holder and plasma as shown in FIG. 1A.

As shown in FIG. 1B, the majority of the current is believed to be supplied by electrons e⁻ emitted from the diamond film 61, as opposed to ions ⊕ accelerated towards the substrate 60. Without wishing to be bound thereto, applicants accordingly theorize that the diamond film 61 contributes to the enhancement of diamond nucleation by either of two mechanism. First, since the diamond film 61 appears to become depleted over time, it is possible that the diamond is being chemically transported from the diamond film 61 to the substrate 60. In other words, it is possible that diamond is being moved from the diamond film 61 to the substrate 60 via an etching and deposition process as described in greater detail below.

Another theory is that increased gas phase dissociation is caused by electron e− emission from the diamond film 61 and the higher concentration of dissociated hydrocarbons are being created by this electron dissociation process. It was also observed that under higher biases, a lower region of the plasma 63a began to appear red, indicative of increased hydrogen dissociation. If hydrogen dissociation is increased, then, hydrocarbon dissociation should increase as well. It is therefore theorized that a higher concentration of dissociated hydrocarbons, as required for diamond nucleation, are being created via this electron dissociation process.

Experiments were performed including measuring the current flux for an alumina coated substrate holder compared to a diamond coated substrate holder and an uncoated holder also at a bias of −250 volts. The results of these experiments are summarized in Table 1 below.

TABLE 1

| Substrate Coating | Current (mA) | Nucleation |
|---|---|---|
| diamond | 100 | high |
| none | 20 | none |
| alumina | 20 | none |

As noted in TABLE 1, when the substrate holder is either uncoated or alumina (insulator) coated, the current is one-fifth that obtained with the diamond coated substrate holder. Moreover, no noticeable nucleation occurred when the substrate holder was either uncoated or alumina coated as compared to the high diamond nucleation densities achieved with the diamond coating on the substrate holder. Accordingly, it is now theorized that the electrically biased diamond film positioned adjacent the substrate provides the predominant effect in achieving high diamond nucleation densities.

The method according to the invention for pretreating a substrate to create a high diamond nucleation density for the growth of a diamond film thereon includes the steps of providing a diamond film adjacent the substrate, and electrically biasing the diamond film while exposing both the substrate and the thus biased diamond film to a carbon-containing plasma.

As noted above, the diamond film is preferably formed on the substrate holder and is biased along with the substrate. The substrate holder is preferably biased at a peak absolute value of −250 volts or greater, with respect to electrical ground. Pulsed DC, AC, and RF may be used to bias the substrate holder. Preferably the carbon-containing plasma has an atomic percentage of carbon of not more than about 0.3 atomic percent, such as provided by a plasma gas mixture including not more than about 5 percent by weight of methane, and more preferably not more than about 2 percent methane by weight. Other carbon-containing gasses may also be used including those selected from the group consisting of ethane, ethylene, acetylene, acetone, ethanol, carbon dioxide, $CCl_4$, $C_2Cl_4H_2$, $CCl_3CF_3$, $CCl_3CH_2OH$ inclusive of aliphatic hydrocarbons with from about 1 to about 10 carbon atoms per molecule.

The pretreatment is preferably carried out for a predetermined time, such as for at least about 1 hour to 2 hours for a high nucleation density and with an electrical bias of about 250 volts negative with respect to ground. The time period roughly equates to the start of the diamond growth on the substrate. It has also been found that the electrical bias should be discontinued after pretreatment in order to grow a high quality diamond film. Accordingly, a thinner, more complete polycrystalline diamond film may be produced over a shorter growth period on a silicon substrate. The method is cleaner and substantially less destructive than scratching, abrading, or externally treating the silicon substrate with a carbon-containing substance. The method according to the present invention has also been found to produce high nucleation density which makes possible more complete and thinner diamond films, such as may be useful for forming thinner diamond windows. The method may also be advantageously used to coat irregularly shaped objects with diamond, such as drill bits, where uniform abrasion of an irregular surface, as required for conventional abrading techniques, is difficult. In addition, better adhesion of the diamond film to the substrate may be obtained by the method according to the invention.

The method according to this aspect of the present invention provides a high nucleation density without requiring scratching or abrading the substrate surface and achieves much higher nucleation densities than those achieved on scratched substrates. The enhanced nucleation allows a complete film composed of small grains to form in a relatively short time. Accordingly, the diamond film formed is smoother compared to conventionally formed diamond films. The relative smoothness of the substrate surface produced by the method according to the present invention permits LRI to be used during the diamond growth process so that real time control of the growth processing parameters is possible.

LRI requires a relatively smooth surface to avoid surface scattering and the commensurate drop in reflected intensity. Current alternatives to LRI usually involve ex-situ analysis such as cross-sectional SEM or profilometry. LRI permits changes in growth to be continuously monitored while a diamond deposition is in progress; thus, changes in these rates during a deposition, either due to purposeful changes in growth parameters or accidental changes due to unforeseen problems can be determined and the processing parameters adjusted accordingly.

LRI operates by the simple superposition of two light waves from both the top surface of the growing diamond film, as well as the interface between the film and the substrate see, for example *"Optical Characterization Techniques for Semiconductor Technology,"* by Olson et al., SPIE, Vol. 276, p. 128 (1981). The light waves add and as the film continues to grow there is a cycling of the intensity due to the alternating periods of both constructive and destructive interference. For monochromatic light the growth rate (R) may be calculated as:

$$R=(\lambda/2\eta)/T,$$

where $\lambda$=wavelength of the laser light, $\eta$=index of refraction of the diamond film, and T=period between interference cycles. For CVD diamond, an index of refraction of natural diamond may be used ($\eta$=2.4). Since this index may vary with the quality of diamond, it may be necessary to adjust the value of $\eta$ utilizing a series of calibration experiments. This may be accomplished by performing depositions to cover the desired extremes in relative quality as determined by some independent technique, such as Raman spectroscopy. Next the thicknesses of the films are measured and compared to those calculated from LRI. One may then solve for $\eta$ in the above equation to determine the index of refraction at those extremes.

During pretreatment there is a period of time during which no diamond growth is detected. LRI permits one to directly observe and account for this nucleation period. During the nucleation period, the reflected intensity is relatively flat, but as soon as the diamond film begins to grow, there is a noticeable decrease in the reflected intensity. Applicants theorize without wishing to be bound to any theory, that this initial drop in reflectivity is due to the absorption of light by the surface film of carbon which is deposited during the pretreatment period. When this drop in intensity is observed, the pretreatment may be stopped and standard diamond growth allowed to begin. Discontinuing the bias voltage thus allows the substrate to have a floating potential. It has been found that if the bias voltage is maintained, then the carbon film will continue to grow, followed by a poorer quality diamond than in the case where the bias voltage is discontinued. LRI makes it possible to measure the nucleation period, as well as the diamond film growth rate, either of which may vary with changes in processing parameters.

Applicants theorize, without wishing to be bound thereto, that the relatively high electrical bias of the present invention creates a higher saturation of diamond growth (carbon) species and thus helps to stabilize the existing nuclei already formed on the substrate. Applicants also theorize that the lower concentration of the carbon-containing gas (e.g., not more than about 5 percent by weight for methane, and preferably not more than about 2 percent by weight methane) during the pretreatment produces a better quality diamond. As the methane concentration is increased for example, more undesirable graphite and amorphous carbon may be incorporated into the diamond. From initial in-vacuo surface analytical measurements coupled with a growth series, little, if any, graphite is formed on the substrate surface if low methane concentrations are used. In contrast, a higher methane (and higher carbon) concentration is likely to form graphite in the early stages of the biasing during the pretreatment. Additionally, if diamond then nucleates on the graphite, the adhesion of the diamond film to the substrate is likely to be very poor. It is further theorized that the relatively long pretreatment time of one to two hours for a mirror finished silicon substrate may give the silicon carbide interfacial film a chance to partially crystallize, thus improving the integrity of the interfacial film.

Another aspect of the present invention is the ability to control the nucleation density of the diamond film over several orders of magnitude by controlling only the pretreatment time.

A further aspect of the invention is that a heteroepitaxial diamond film may be formed on a substrate having a surface film of a material with a relatively close lattice match with diamond selected from the group consisting of refractory metals and their carbides, cubic-boron nitride, $\alpha$-silicon carbide, $\beta$-silicon carbide, copper, and nickel. The term "refractory metal" relates to a metal which exhibits refractory properties, namely a metal characterized by its ability to withstand extremely high temperatures (i.e., temperatures greater than about 1500° C.). Exemplary refractory metals are transition element metals, and preferably are selected from the group consisting of Group IV, V and VI transition element metals (CRC Handbook, 71st Ed.). Exemplary refractory metals include titanium, tantalum, tungsten, molybdenum, hafnium and niobium.

The surface film of the substrate is pretreated as described above, however, the biasing is preferably carried out for a shorter time of not more than about 30 minutes at an absolute value of not less than about 250 volts negative with respect to ground to prevent damage to the substrate surface film. As described in further detail below in Example 6, a $\beta$-SiC film on a silicon substrate was pretreated with the electrical bias producing a locally heteroepitaxial diamond film.

These and other aspects of the present invention are more fully explained below in the following Examples which are illustrative but not limiting of the invention. In the Examples, chemical compositions and structures were characterized by X-ray photoelectron spectroscopy (XPS), auger electron spectroscopy (AES), and surface electron energy loss spectroscopy (EELS), as well as high resolution cross-sectional transmission electron microscopy (XTEM), scanning electron microscopy (SEM) and Raman spectroscopy.

Example 1

Figure 2:
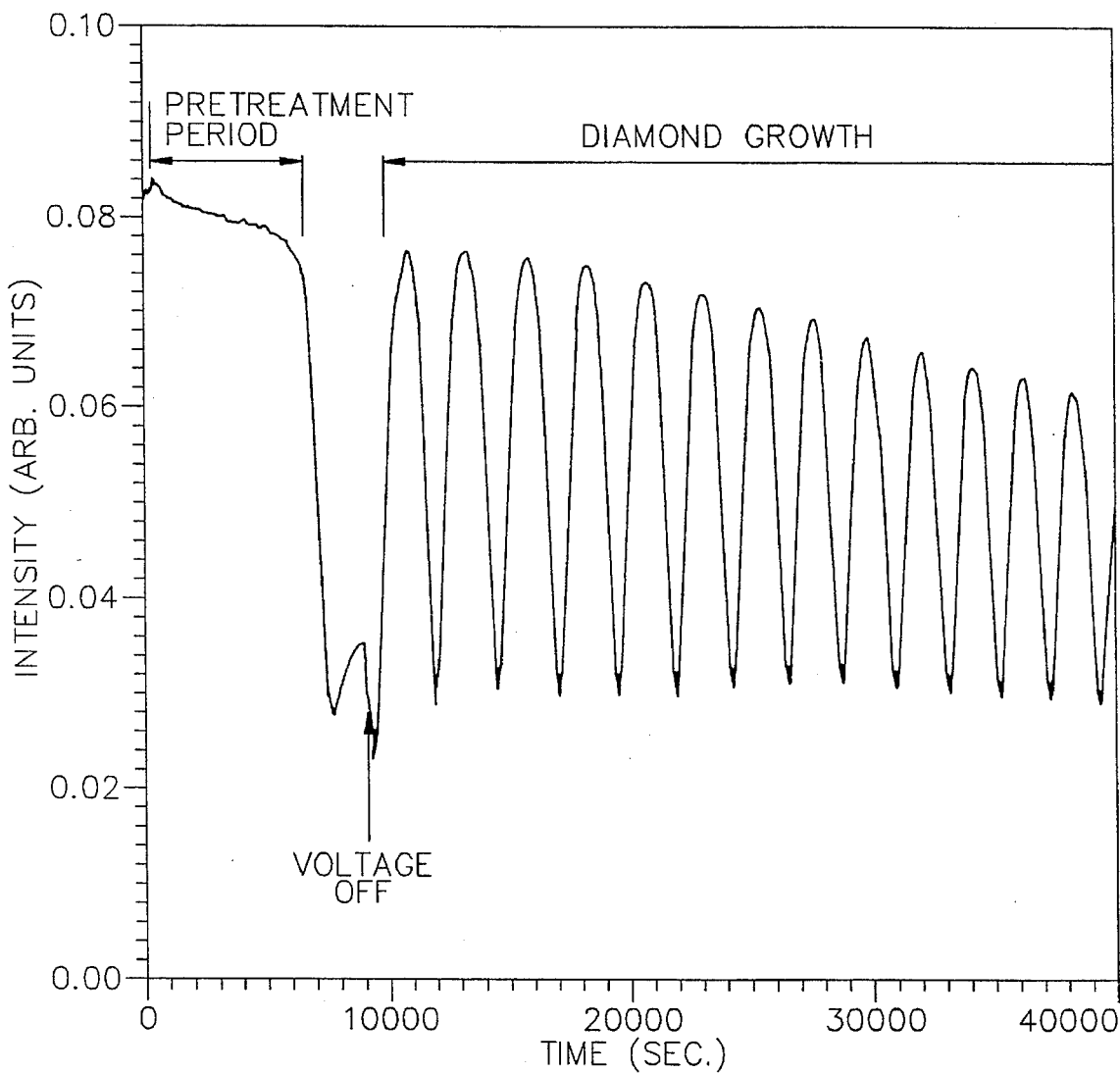
FIG. 2 is a graph showing interference cycles in the reflected intensity during diamond film growth corresponding to Example 1.

The diamond films for this example were prepared in an apparatus similar to that shown schematically in FIGS. 1A and 1B. Referring to FIG. 2 there is shown the results of using LRI to monitor the diamond growth rate in the apparatus. The laser light was reflected nearly perpendicular to the substrate and the reflected intensity, monitored via a silicon photodiode, was recorded by a computer. The helium-neon laser ($\lambda$=630 nm) corresponded to 0.13 µm film growth per intensity cycle in the case of a high quality diamond film having $\eta$=2.4. Several initial calibration runs were performed with methane percentages ranging from 0.5% to 5%. Even in the case of the poorest quality film, the actual thicknesses varied less than 10% for films 1–4 µm thick, from that measured assuming $\eta$=2.4.

In the present example, the bias voltage to the substrate was approximately −250 volts with respect to ground and the current drawn was approximately 100 mA, (between about 75–125 mA) for a 1% by weight methane in hydrogen gas mixture at 15 torr. The optimum period for pretreatment appeared to be approximately 1 to 2 hours.

Figure 3A:
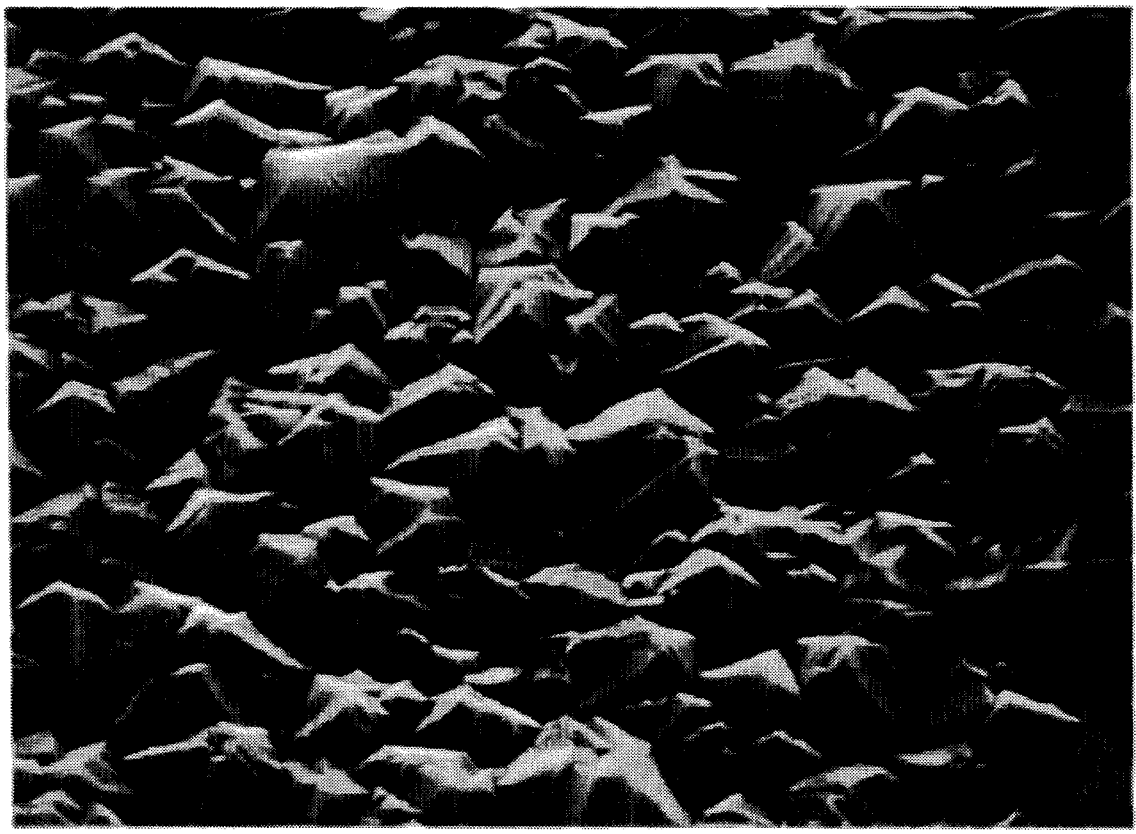
FIGS. 3A and 3B are an SEM photograph and Raman spectra, respectively, of diamond film growth, corresponding to Example 1.
Figure 3B:
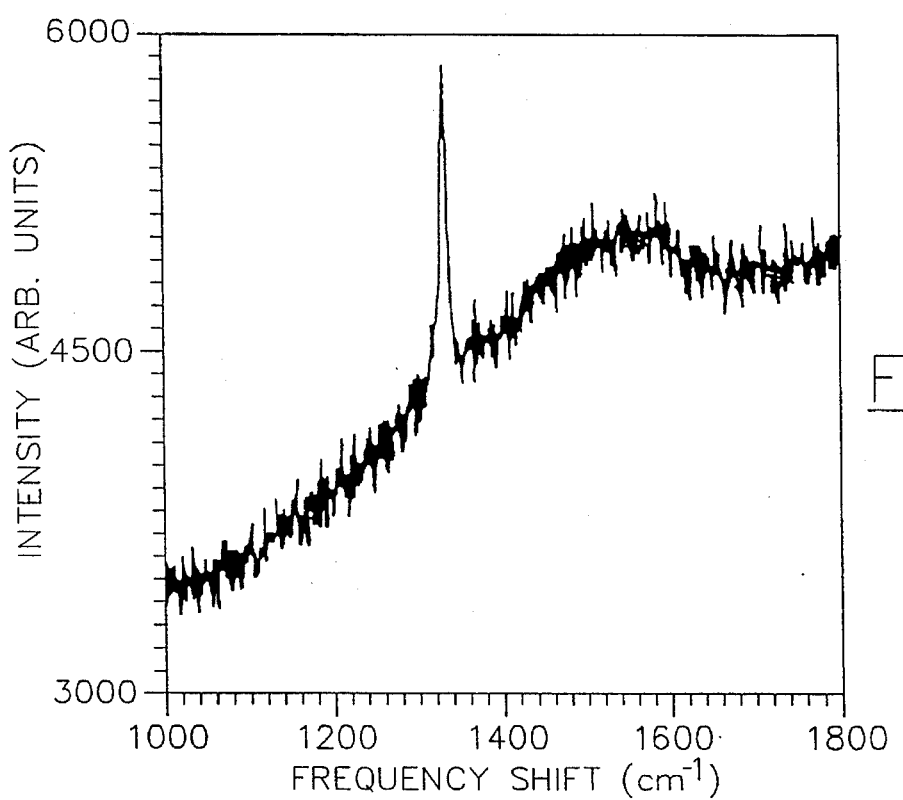

Both SEM and Raman spectroscopy were used to determine the quality of the diamond grown on the pretreatment film as shown in FIGS. 3A and 3B, respectively. The diamond films shown were grown on unscratched silicon substrates at 25 torr in a 1% methane in hydrogen mixture. The total flow rate was 1000 sccm, and the microwave power was about 750 watts.

There appeared to be a relationship between the ion current and the time required to grow an appropriate nucleation film. By visibly decreasing the roughness of the final diamond film surface, the pretreatment method made it possible for LRI to be conducted during growth of the diamond film on an as-received mirror finish silicon substrate for up to 60 hours of diamond growth.

Example 2

In this example, a processing apparatus similar to that shown schematically in FIGS. 1A and 1B was used to grow a diamond film onto a pretreated silicon substrate. FIG. 4B shows a substrate pretreated according to the present invention with a diamond film grown thereon. The substrate was electrically biased at −250 volts with respect to ground, and immersed in a 2% methane in hydrogen plasma for 1 hour. The total flow rate was 1000 sccm, the net microwave power was maintained at 600 watts and the pressure was 15 torr. The thus pretreated substrate was then grown on for 5 hours using conventional CVD techniques.

Figure 4A:
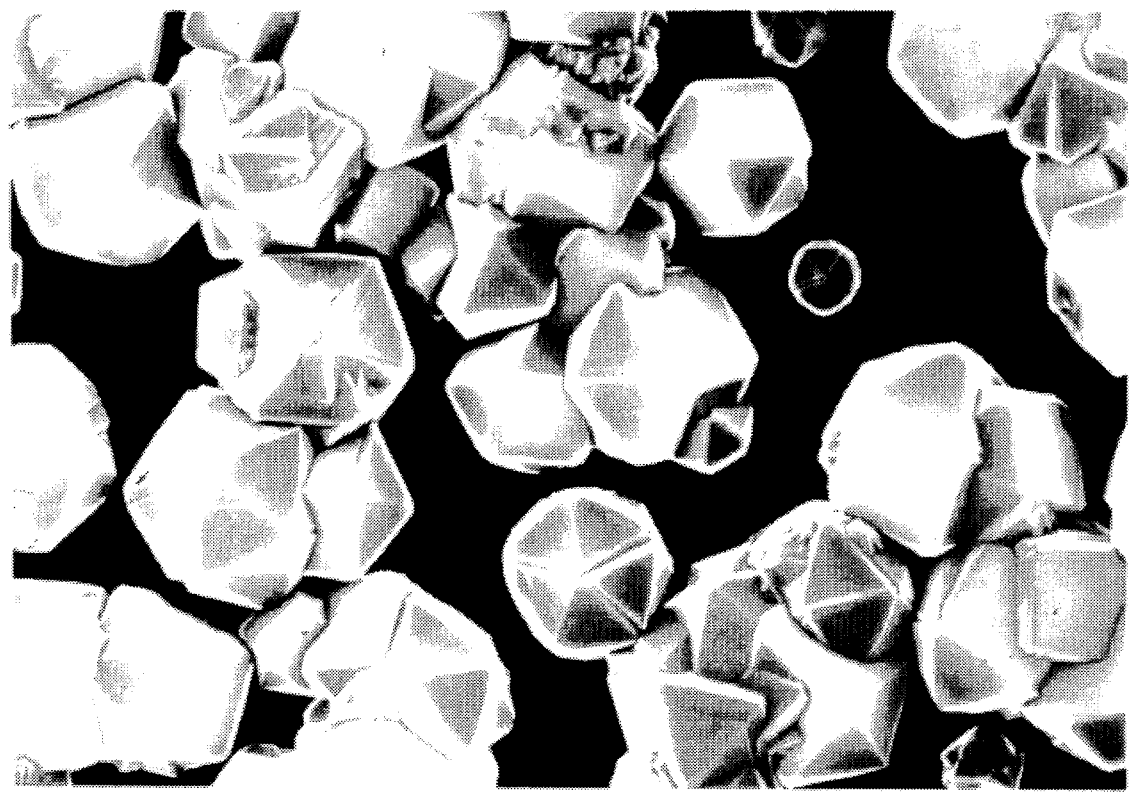
FIG. 4A is an SEM photograph of a silicon substrate pretreated by scratching with 0.25 μm diamond powder prior to diamond deposition as in the prior art.
Figure 4B:
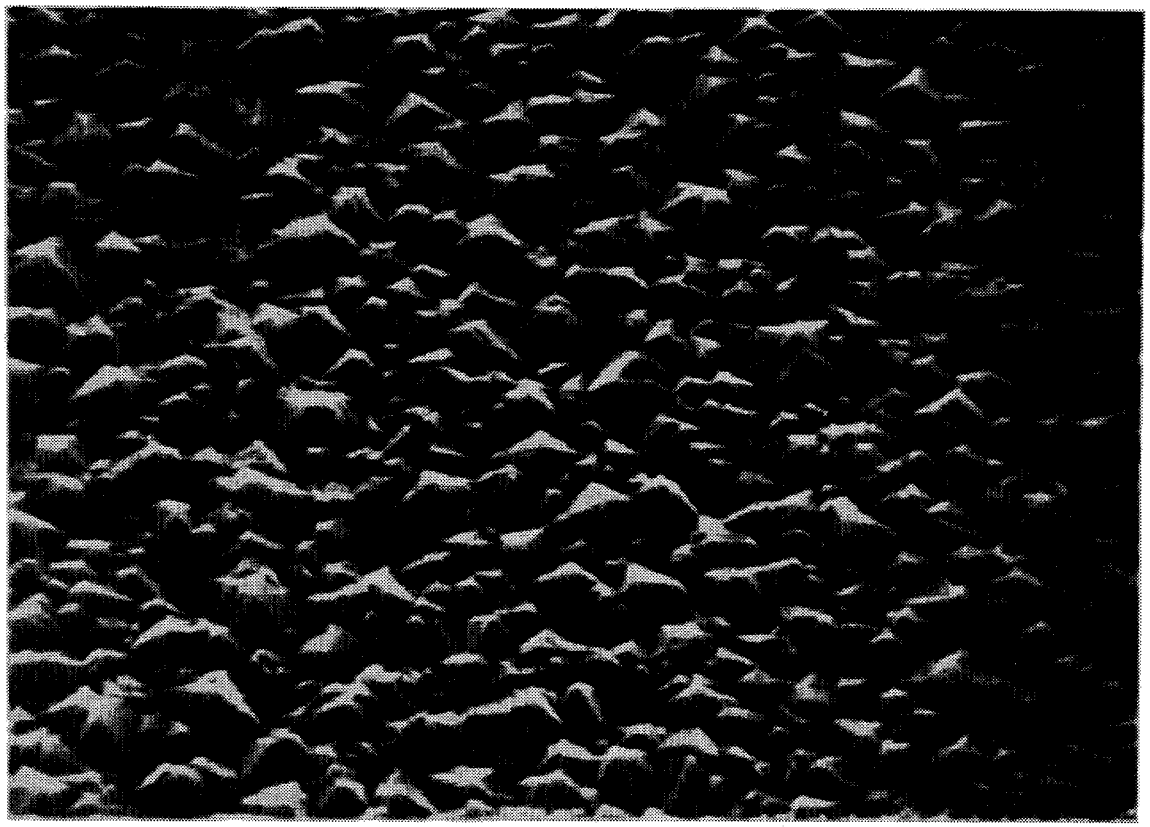
FIG. 4B is an SEM photograph of a silicon substrate pretreated according to the method of the present invention corresponding to Example 2.
Figure 5:
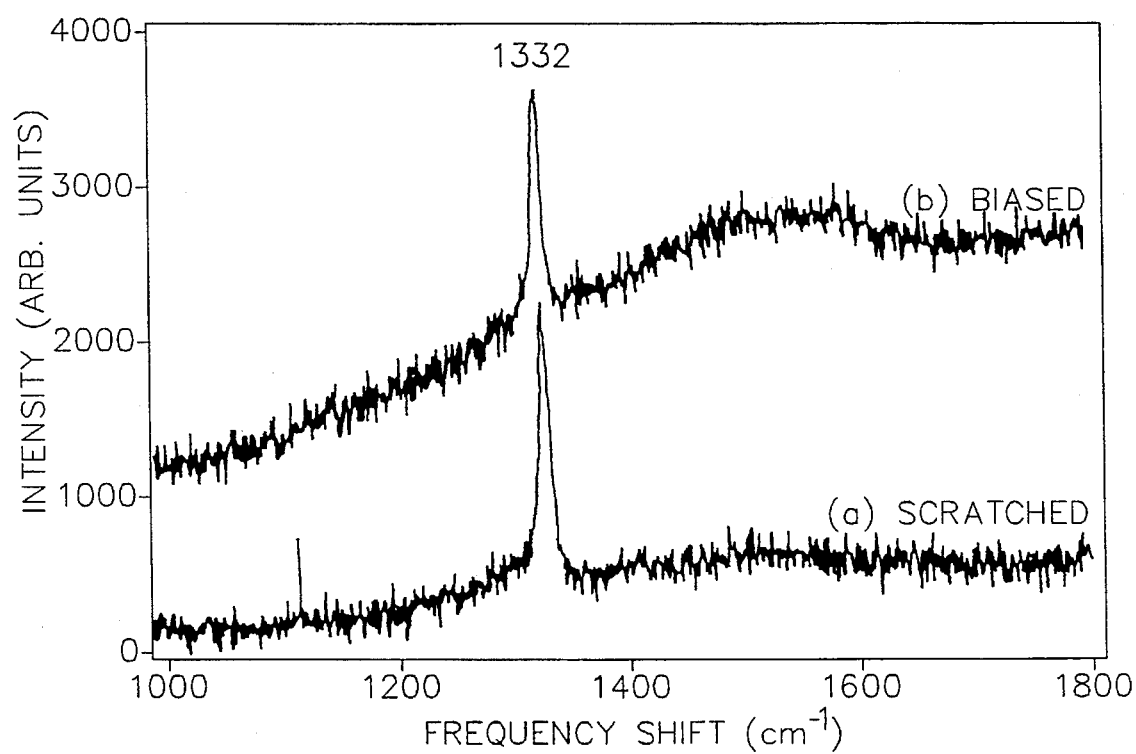
FIG. 5 is Raman spectra of the pretreated silicon substrate as shown in FIG. 4A and the scratched substrate as shown in FIG. 4B.

FIG. 4A, in comparison, shows a silicon substrate that was scratched with 0.25 µm diamond paste, as in the prior art, and then subjected to an identical growth of 5 hours. Raman spectra for both the scratched and pretreated silicon substrates, (a) and (b) respectively, are shown in FIG. 5. The smaller diamond peak (1332 cm$^{-1}$) and larger background observed from the pretreated sample is indicative of a film with a higher nucleation density and a larger number of grain boundaries.

Pretreated substrates were found to have a nucleation density of up to $10^{11}$/cm$^2$ depending on the length of the pretreatment time. This contrast with the scratched substrate density of $10^7$/cm$^2$ or a pristine substrate nucleation density of only about $10^4$/cm$^2$. Thus, four orders of magnitude improvement in nucleation density was achieved by pretreatment over scratched samples, and the resulting diamond films formed on the pretreated substrates showed better thickness uniformity and lower surface roughness.

Example 3

In this example a processing apparatus similar to that shown schematically in FIGS. 1A and 1B was used along with other conventional measuring devices and techniques. In this example, results were obtained which indicate that nucleation density of a diamond film may be controlled over five orders of magnitude by altering the electrical bias pretreatment time. As would readily be appreciated by those skilled in the art, the ability to so control nucleation density by controlling only a single processing parameter has many advantages.

A series of pretreatments were interrupted at set intervals and then the substrate was analyzed in-vacuo to observe the corresponding changes in surface chemistry to systematically observe the nucleation process. Table 2 below outlines the measurements performed for this pretreatment series.

TABLE 2

| Bias Time (min/hrs) | Analysis Performed | | |
|---|---|---|---|
| | XPS/AES | XPS-EELS | RamanSEMTEM |
| Before Bias | X | | |
| 1 min. | X | | |
| 5 min. | X | X | |
| 15 min. | X | X | |
| 30 min. | X | X | X |
| 1 hr. | X | X | X |
| 1.5 hrs. | X | X | X | X |
| 2.0 hrs. | X | X | X | X |

One centimeter square samples were prepared from undoped silicon substrates. They were ultrasonically cleaned in trichloroethylene (TCE), acetone, methanol, 2-Propanol and the rinsed in deionized (DI) water. Just prior to insertion into the processing apparatus, they were dipped for 1 minute into a 1:10 mixture of hydrofluoric acid in DI water to remove any existing native oxide, rinsed in DI water and then blown dry with nitrogen. This procedure was to ensure minimal surface oxidation and hydrocarbon contamination on each of the samples.

The substrates were electrically biased at 250 volts negative with respect to ground, immersed in a 2% methane-in-hydrogen plasma. The total flow rate was 1000 sccm, the net microwave power was maintained at 600 watts and the pressure was 15 torr. Individual samples were biased for 1, 5, 15, 30, 60, 90 and 120 minutes. The plasma and electrical bias were then shut off, the chamber was evacuated to 10$^{-7}$ torr, and the sample was subsequently transferred to a surface analytical chamber. In the analytical chamber, XPS, SPS-EELS and AES were performed on each sample. An as-inserted sample was also analyzed to observe the chemical species present on the surface before pretreatment was initiated.

Figure 6A:
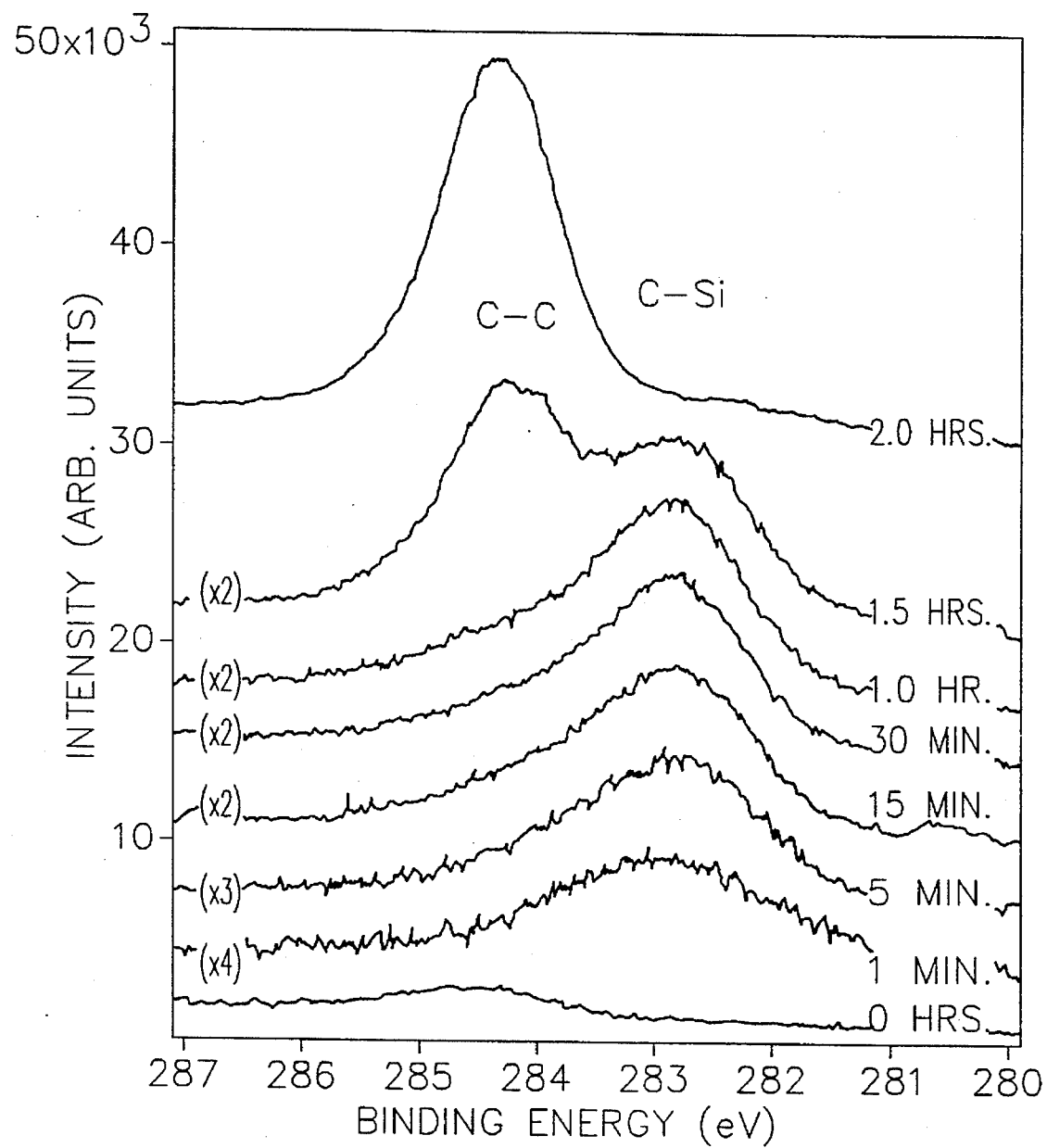
FIGS. 6A and 6B are XPS analyses as a function of bias pretreatment time showing the C-1s and Si-2p peak progressions, respectively, corresponding to Example 3.

FIG. 6A shows the carbon 1s (C-1s) core level peak observed using XPS, as a function of electrical bias time of which the quantitative analysis is shown below in Table 3.

TABLE 3

| Bias Time (min. or hrs.) | Carbon 1s Peak Ratios C—C:Si—C | Silicon 2p Peak Ratios Si—Si:Si—C:(Si—O) | Concentration Ratios (C:Si) |
|---|---|---|---|
| 0.0 hrs. | ($C_xH_yO_z$) | 100:0 | 16:84 |
| 5 min. | 22:78 | 44:43:(13) | 26:74 |
| 15 min. | 22:78 | 26:74 | 32:68 |
| 30 min. | 20:80 | 20:80 | 33:67 |
| 1 hr. | 20:80 | 1:99 | 37:63 |
| 1.5 hrs. | 54:46 | 12:88 | 48:52 |
| 2.0 hrs. | 90:10 | 11:89 | 92:08 |

The silicon substrate was found to have a small amount of carbon contamination on it before electrical biasing began. This carbon contamination was found to be either removed or converted into SiC in the first 5 minutes of biasing. From 5 minutes to 1 hour, the majority of the carbon on the surface has a binding energy of 282.8 eV and is assigned to Si-C bonding. Deconvolution of the C-1s peaks show that a smaller peak, approximately 20% exists at 284.3 Ev characteristic of C—C bonding. The origin and structure of this excess C—C bonding is unclear as is its effect on the nucleation density. Since XPS core level shifts can only give chemical bonding information, they are not capable of distinguishing between diamond, graphite and amorphous carbon.

It is unlikely that the C—C peak represents diamond since such a large difference in nucleation density is observed for biases of 5 minutes to 1 hour. The fact that the relative percentage of this peak to the total C-1s is fairly constant at 20% for 5 minutes to 1 hour, leads applicants to theorize without wishing to be bound thereto, that the carbon could be on the surface of the film. A post biasing sputter with argon in the processing apparatus was successful in removing the C—C resulting in a single Si-C peak at 282.8 Ev, thus confirming that the carbon was confined to the surface. Applicants further theorize that the small amount of carbon is caused by the biasing process, such as excess etching or sublimation of the Si from the Si-C, or the increased flux of hydrocarbon ions to the surface.

Figure 6B:
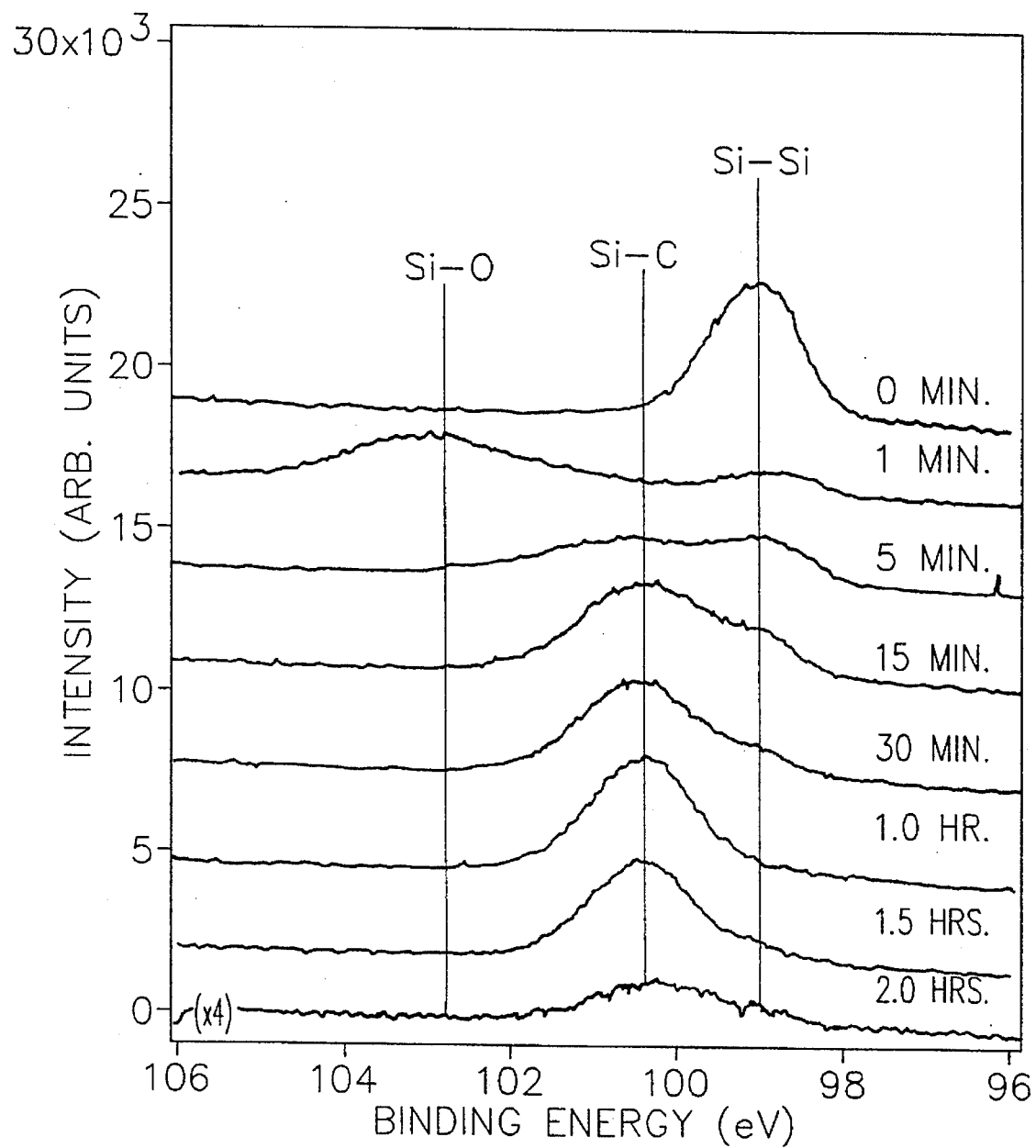

The Si-2p peak shown in FIG. 6B was used to observe the chemical transformation of the silicon substrate as a function of bias time. Before biasing begins, there exists only a single peak at 99.0 Ev, which is representative of elemental silicon. After just 1 minute of biasing, a majority of the silicon observed has been converted into silicon oxide (102.7 eV). By 15 minutes of biasing, however, the oxide has been totally removed and the resulting peak is a mixture of elemental silicon (99.0 eV) and Si-C (100.3 eV). From 15 minutes to 1 hour, the Si-C peak steadily increases to nearly 100%, suggesting that it is covering the silicon substrate. At 1.5 hours, corresponding to the sharp increase in C-1s peak at 284.3 eV (FIG. 6A) there is a reemergence of the elemental silicon signal at 99.0 eV. This suggests that etching of the interfacial Si-C film may be occurring thereby bringing Si closer to the surface and causing an increase in the Si signal. By 2 hours, the C-1s peak shows over 90% C—C bonding, and the carbon-to-silicon ratio is up to over 90% as well, indicating that the surface is nearly covered with some elemental form of carbon shown to be diamond by AES, XPS-EELS, and Raman spectroscopy as explained below.

The XPS series showed that a SiC film develops before the surface becomes covered with the elemental form of carbon. Overlayer calculations were used to determine the approximate thickness of this film as a function of bias time. Calculations are based on an inelastic electron mean free path of 20 Å, and assume a layer-by-layer growth model of the SiC overlayer for simplicity. The results of these calculations are shown below in Table 4.

TABLE 4

| Bias Time (min. or hrs.) | Si—C film Thickness (Å) | C—C (Å) | Si—O (Å) |
|---|---|---|---|
| 0.0 hrs. | — | 4 | 0 |
| 5 min. | 12 | 6 | 4 |
| 15 min. | 27 | 8 | 0 |
| 30 min. | 32 | 8 | 0 |
| 1 hr. | 90 | 9 | 0 |
| 1.5 hrs. | 42 | (Diamond) | 0 |
| 2.0 hrs. | 44 | (Diamond) | 0 |

Before biasing, there exists a clean silicon substrate with approximately 4 Å of the amorphous and hydrogenated carbon on the surface. From 5 minutes to 1 hour, the carbide thickness climbs from approximately 10 to 90 Å while the carbon increases slightly from 5 to 10 Å. At 1.5 hours, concurrent with the observed increase in the elemental silicon peak, the carbide thickness drops drastically back down to approximately 45 Å, and remains relatively unchanged by 2 hours.

It should be noted that the layer-by-layer approximation used above may result in a lower calculated value for the interfacial carbide thickness than has actually occurred. If the carbide film at 1 hour had a uniform thickness of 90 Å and the subsequent etching was nonuniform, that is, island-like, then the actual average thickness would be higher than the 45 Å calculated above. There would still be a decrease in the overall thickness from 1 hour to 1.5 hours, yet not quite as drastic as estimated.

Figure 7A:
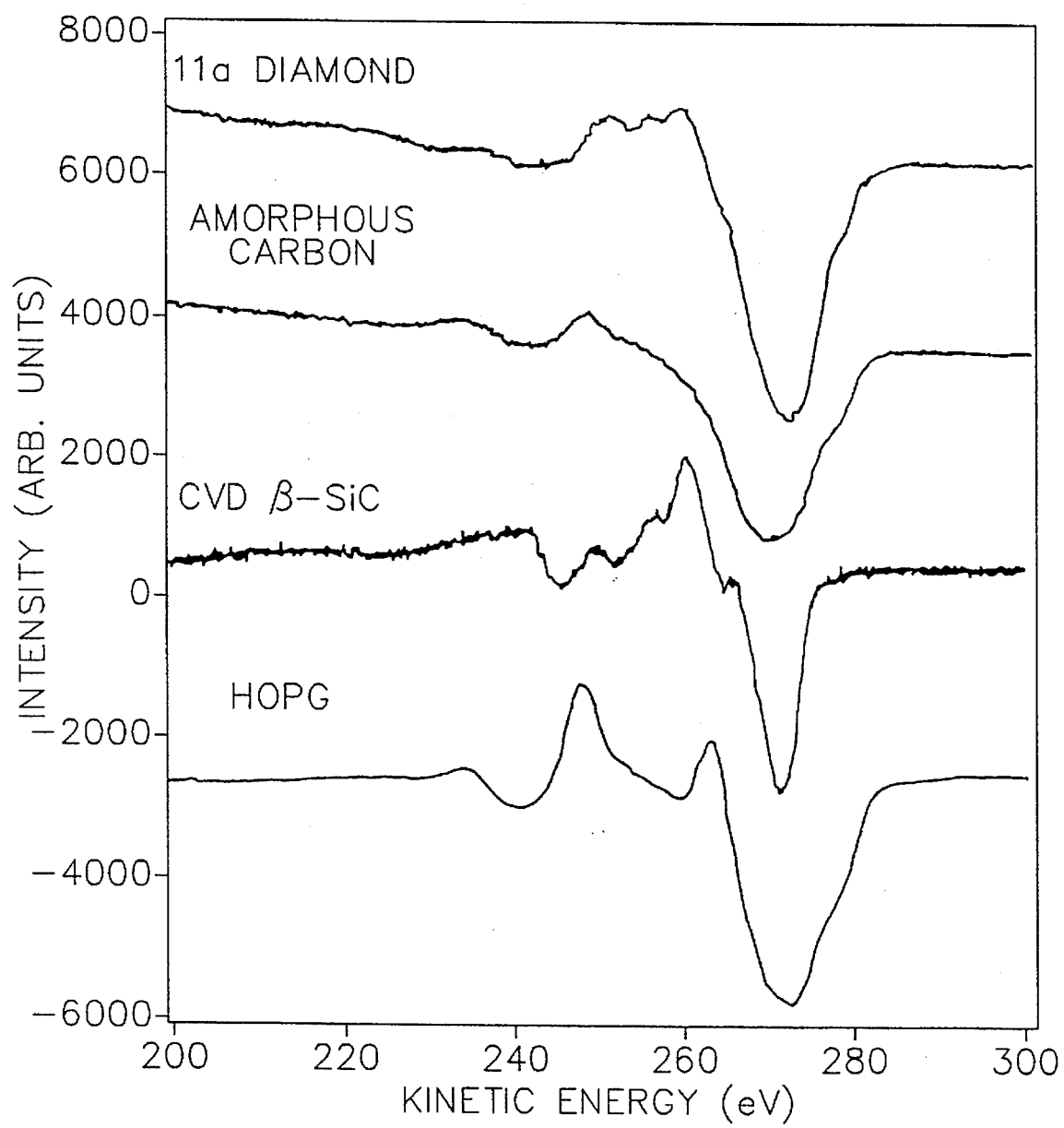
FIGS. 7A and 7B are an AES and XPS-EELS spectra, respectively, from single crystal diamond, amorphous carbon, single crystal SiC, and highly ordered pyrolytic graphite (HOPG), corresponding to Example 3.
Figure 7B:
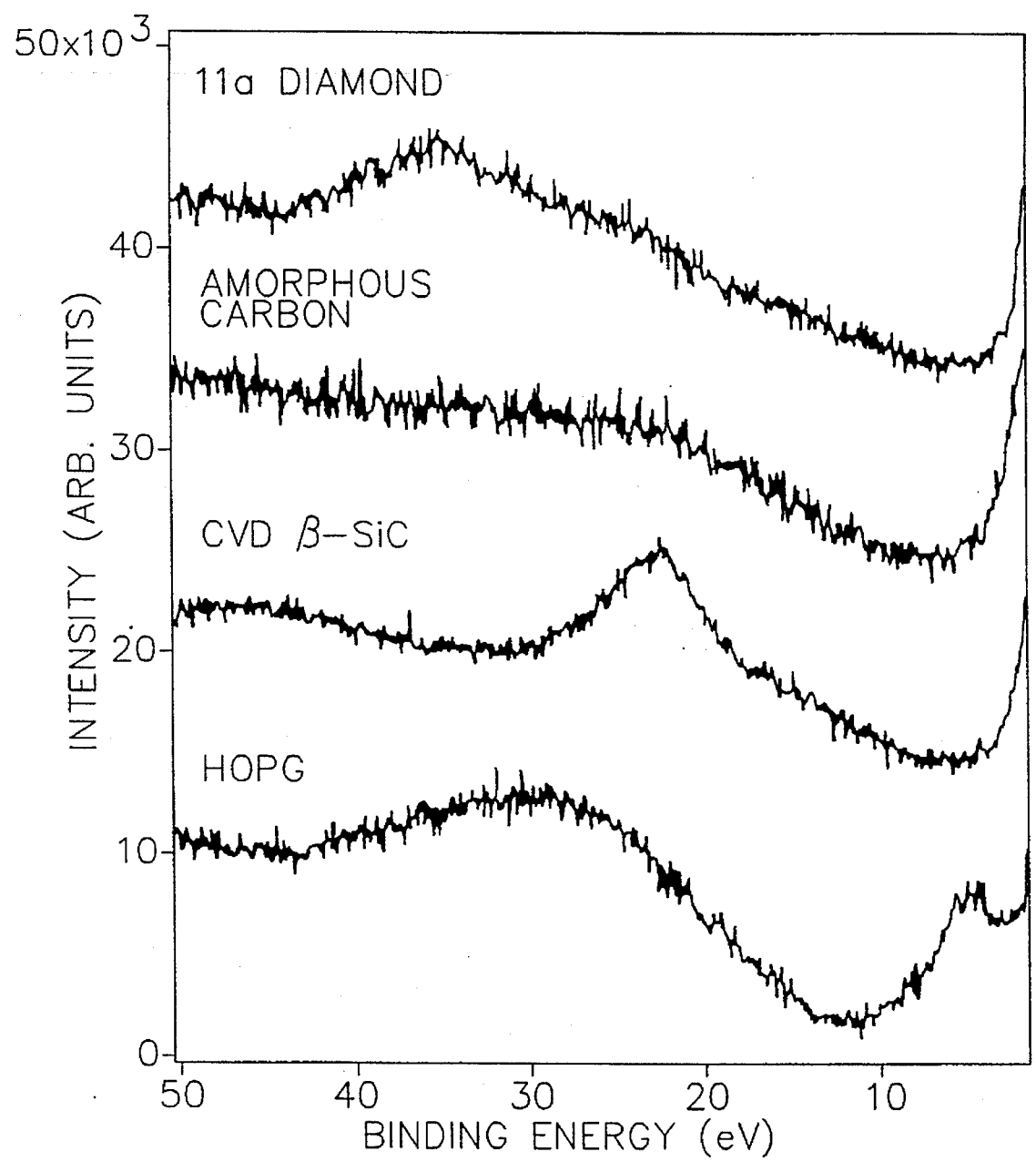
Figure 8A:
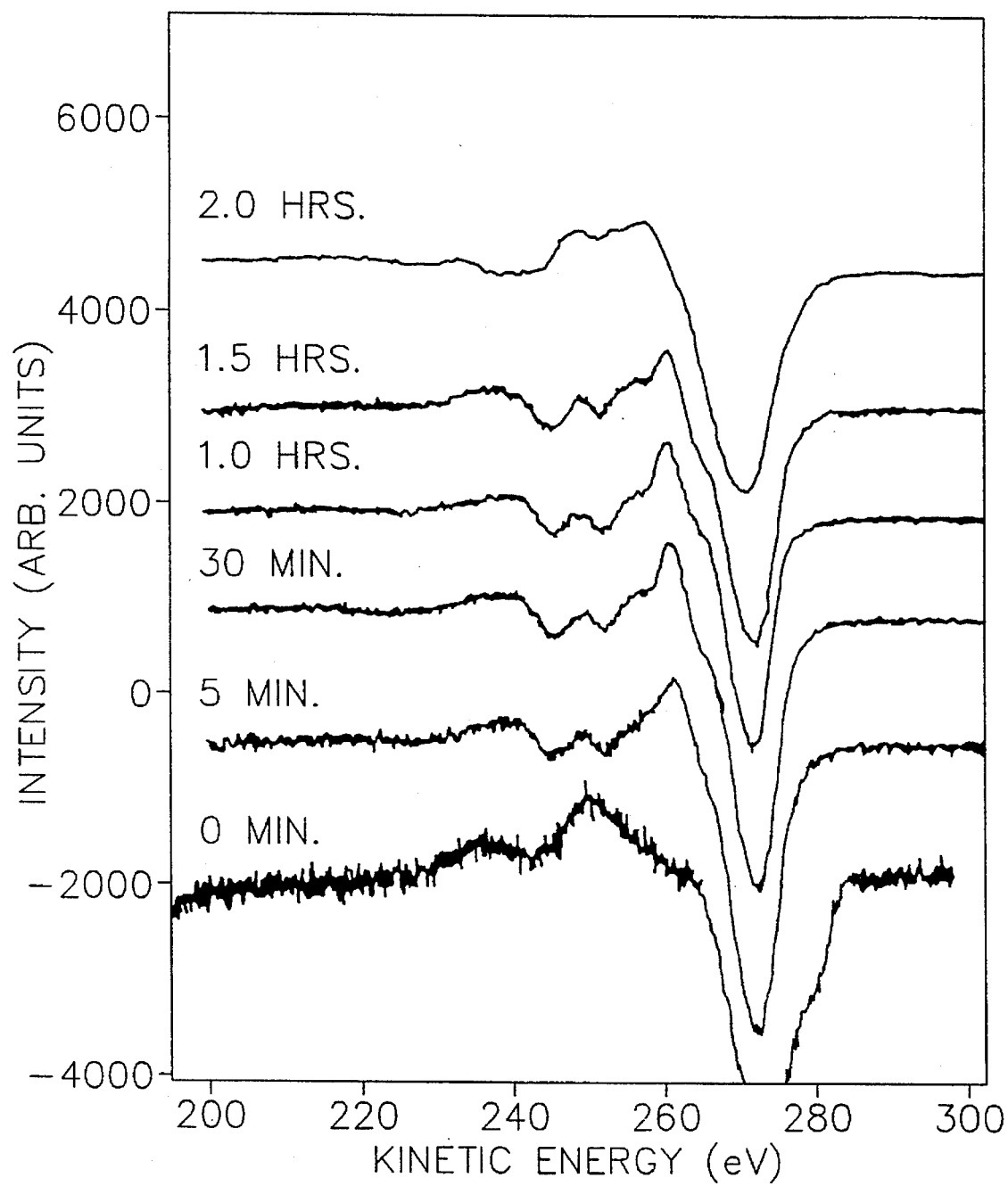
FIGS. 8A and 8B are an auger electron spectra.

Since the XPS core level shifts can only provide chemical bonding information, C-EELS and AES were used to help provide information as to the crystalline structure of the different forms of carbon observed on the surface during the series. FIGS. 7A and 7B both show standard AES and XPS-EELS spectra, respectively, taken from natural type IIA diamond, sputtered amorphous carbon, SiC, and highly ordered pyrolytic graphite (HOPG). The AES bias time series shown in FIG. 8A shows a transition from the hydrogenated and amorphous carbon that exists on the surface before biasing begins to a fine structure resembling SiC by 15 minutes, then to one resembling diamond by 2 hours of biasing. There is a subtle change from the 1 hour bias sample to the 1.5 hour case.

Figure 8B:
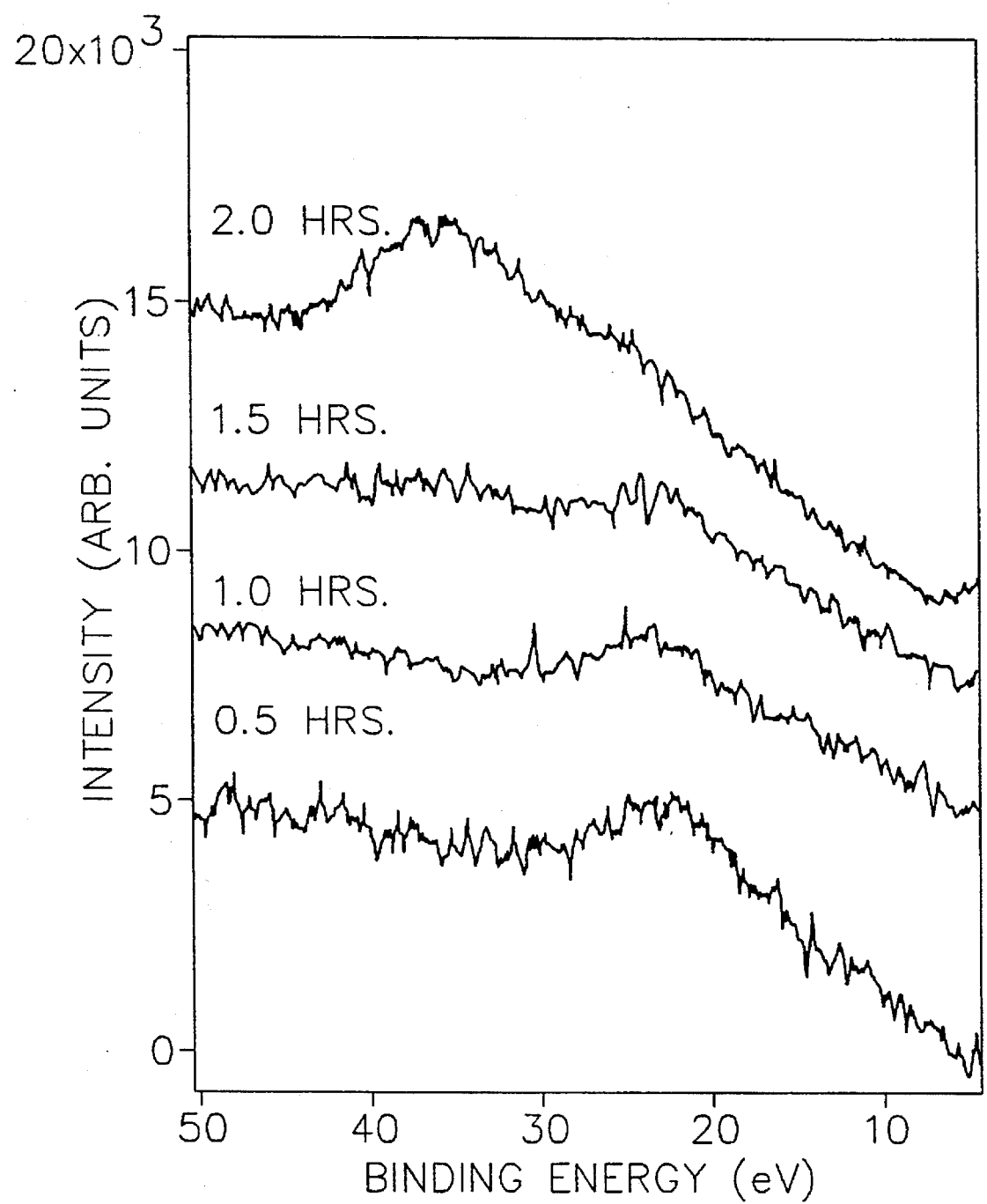

From the XPS-EELS data shown in FIG. 8B, the transition from SiC to diamond is much more evident. From the standards shown in FIG. 7B, SiC has a characteristic bulk plasmon peak at 23 eV and diamond has both bulk and surface plasmon peaks at 35 eV and 25 eV respectively. As shown, at 0.5 hours, the spectra clearly resembles that of SiC, with a single bulk plasmon peak at 23 eV, and at 2 hours resembles diamond with both bulk and surface plasmon peaks at 35 eV and 25 eV respectively. However, at 1.5 hours the spectra is a clear mixture of both diamond and SiC, thus suggesting that some diamond is present on the surface after 1.5 hours of biasing.

Based upon this data, applicants theorize without wishing to be bound to the theory, that the sharp rise in the C-1s peak at 284.3 eV after 1.5 hours of bias as shown in FIG. 6A was due to increase in the number of diamond nuclei on the surface. In addition, in the spectra for the carbon XPS-EELS, no peak at 6 eV off of the core level was observed, thus suggesting that graphite was not present on the surface throughout the biasing, at least within the sensitivity limits of the measurement technique.

To further demonstrate that the carbon observed after 1.5 and 2 hours of bias was diamond, Raman spectroscopy was performed. Due to the relatively low cross-section for diamond, 10 scans were performed and then subsequently superimposed in order to improve the signal-to-noise ratio. The carbon concentration on the 1.5 hour sample was still too low to observe with this technique, however, the 2 hour sample did produce a small characteristic diamond peak at 1332 cm$^{-1}$, as shown FIG. 9. No graphitic peaks were observed near 1580 cm$^{-1}$. Since graphite has about a 50 times higher Raman cross-section than does diamond, it is highly improvable that the diamond could have nucleated on graphite. If so, a Raman peak at 1580 cm$^{-1}$ would have been observed for a nucleation density as high as obtained here.

As shown in FIGS. 10A–10C, SEMs were also taken at 1 hour (FIG. 10A), 1.5 hours (FIG. 10B), and 2 hours (FIG. 10C) bias to see if the diamond could be observed. The 2 hour sample of FIG. 10C showed that the surface was about 90% covered with diamond particles ranging in size from 10 to 60 nm in diameter as measured within the resolution of the Hitachi H-5000 field emission microscope. The nucleation density from the 2 hour sample was observed to be about $5\times10^{10}$/cm$^2$ since particles less than 10 nm could not be observed with the microscope used. The 1.5 and 1 hour samples showed decreasing nucleation densities of about $5\times10^9$ and $5\times10^8$/cm$^2$ respectively. The 30 minute sample had a very small number of observable nuclei present making it difficult to obtain an accurate measure of nucleation density. Therefore, nucleation density for the 30 minute sample was determined based upon a 10 hour growth on the 30 minute bias pretreatment that produced an approximately 75% complete diamond film and that yielded a density of $1\times10^7$/cm$^2$. FIG. 11 shows a graph of nucleation density versus bias time. From this data it would be readily understood by those skilled in the art that the nucleation density could be controlled by over 6 orders of magnitude by controlling the bias pretreatment time alone.

Data from the AES, XPS-EELS, Raman and SEM all suggest and self-consistently confirm that diamond is nucleating during the biasing pretreatment. Diamond particles may be observed by SEM at as early as 30 minutes of biasing. Nucleation continues for up to 2 hours, at which time the surface is nearly covered with nuclei no larger than 80 nm in diameter. This confirms that the biasing pretreatment is actually creating the diamond nuclei, as composed to just creating sites that are favorable for diamond nucleation. If the bias pretreatment is continued long after the nominal 2 hour period, a much poorer quality diamond film results, thus suggesting that conditions favorable for nucleation are not so for diamond growth.

Example 4

In the series of experiments for this example, an apparatus similar to that illustrated in FIGS. 1A and 1B was used. Table 5 below outlines the experiments and analyses performed in this example.

TABLE 5

| Bias/Growth Time (min/hrs) | Analysis Performed | | | | |
|---|---|---|---|---|---|
| | XS/AES | XPS-EELS | Raman | SEM | TEM |
| 1.0/0.0 | X | X | | X | |
| 1.0/0.75 | X | X | | | |
| 1.0/1.0 | X | X | | X | |
| 1.0/2.0 | X | X | | X | |
| 1.0/5.0 | X | X | X | X | X |

The substrates were prepared identically to those in the preceding example. The substrates were then pretreated as described in the preceding example for 1 hour. At the end of pretreatment, the electrical biasing was discontinued, the methane concentration was reduced to 1% at 1000 sccm of hydrogen, the pressure was increased to 25 torr and the substrates were repositioned to a distance of 0.5 cm from the plasma. Diamond film samples were then grown on these pretreated substrates for 0.75, 1, 2, and 5 hours. The results from the surface analysis for this series are summarized in Table 6 below.

TABLE 6

| Bias/Growth Time (hrs./hrs.) | Carbon 1s Peak Ratios C—C:Si—C | Silicon 2p Peak Ratios Si—Si:Si—C:(Si—O) | Concentration Ratios (C:Si) |
|---|---|---|---|
| 0.0/0. 0 | (C$_x$H$_y$O$_z$) | 100:0 | 16:84 |
| 0.08/0.0 | 22:78 | 44:43:(13) | 26:74 |
| 0.25/0.0 | 22:78 | 26:74 | 32:68 |
| 0.5/0.0 | 20:80 | 20:80 | 33:67 |
| 1.0/0.0 | 20:80 | 1:99 | 37:63 |
| 1.0/0.75 | 43:57 | 10:90 | 35:65 |
| 1.0/1.0 | 50:50 | 14:86 | 41:59 |
| 1.0/2.0 | 76:24 | 35:65 | 52:48 |
| 1.0/5.0 | 100:0 | — | 100:0 |

From observing the C-1s peak as a function of growth time as shown in FIG. 12A, a steady increase in C—C bonding (284.3 eV) is shown from when the bias is discontinued and the growth begins, until the substrate is totally covered with diamond at the 5 hour mark. Of special interest is the Si-2p peak in FIG. 12B. When the bias is discontinued at 1 hour, the surface has been almost totally converted to SiC. After just 45 minutes of growth on this surface, the relative contribution of reduced Si to the total Si-2p peak has increased to 10% while the carbon-to-silicon ratio has remained nearly constant. Applicants theorize without wishing to be bound to the theory, that as the individual diamond particles are growing, as indicated by the increase in the C-1s peak at 284.3 eV, that etching of the SiC surface/interfacial film may be exposing silicon from the original substrate. It is not necessary to totally expose the silicon in order to observe it by XPS. Given the theoretical escape depth for silicon, it should still be possible to observe the signal if it is covered by as much as 80–100 Å of SiC. If the SiC is amorphous, the escape depth may be slightly longer. By 2 hours of growth after biasing, the carbon-to-silicon ratio has increased to over 50%, with 76% of the C-1s signal originating from C—C bonding. The contribution from Si—Si bonding to the Si-2p peak has now increased to 35%, further suggesting that etching of the SiC interfacial film may be continuing as the diamond particles continue to grow.

Overlayer calculations, similar to those described in the preceding example, indicate that once the bias is discontinued, the Si-C film begins to diminish rapidly. The interfacial film reduces in average thickness, from 90 Å at the end of biasing, to 40 Å by 1 hour and 20 Å by 2 hours of growth. This data further suggests that the SiC film is being etched, or removed, once significant diamond growth occurs. As mentioned previously, the actual decrease in carbide thickness will not be as sharp if the etching, or removal of the carbide is nonuniform.

The AES spectra, in FIG. 13A continue to show a strong contribution from the SiC and do not resemble diamond until after 5 hours of growth. The XPS-EELS series on the other hand shows in FIG. 13B that the contribution from diamond begins to become significant by 1 hour of growth, and continues until the film is complete at 5 hours. FIGS. 14A and 14B shown SEM photographs taken from a sample after just the 1 hour pretreatment (FIG. 14A) and after an additional 1 hour of diamond growth (FIG. 14B). The SEMs show that after the bias is discontinued, no more significant nucleation occurs and that the diamond growth continues primarily on the nuclei that existed at the end of the pretreatment period. The nucleation density remains relatively unchanged throughout the growth and average particle diameter increases in size.

It is important to comment on the sensitivity of the XPS-EELS in observing diamond nucleation on, in this case, SiC. Based on the SEMs discussed above for the 1 hour biased sample (FIG. 14B), the nucleation density of diamond particles on the surface was approximately $5\times10^8/cm^2$ and they were 10 to 50 nm in diameter. This concentration may be too small to be detected by XPS-EELS. A rough area calculation based on an average particle diameter of 20 nm indicates that the percentage of the sampling area covered by the diamond particles would be only 0.2%. For the sample that was grown for 1 hour after biasing, the average particle diameter is near 100 nm. From this, the average sampling area occupied by the diamond has increased to over 4%. Based on these calculations and the data presented above, the XPS core level measurements are an effective means of determining the amount of specific phases on the surface during the nucleation process, but XPS-EELS may only be used to obtain structural information for surface concentrations in excess of 2–4%.

Thus, from the bias and growth series discussed above, the data suggests that diamond grows primarily on the diamond particles that existed on the surface after the initial biasing pretreatment. SEM micrographs at different post-biasing growth times show that the initial particles just increase in size and develop better crystal habits with time. The discontinuation of nucleation once biasing ceases suggests again that ideal growth conditions may not be favorable for nucleation. As the diamond particles grow, there appears to be etching of the SiC film as suggested by the increase in the Si—Si bonding observed in the XPS Si-2p series.

Example 5

FIG. 15 shows a low magnification high resolution XTEM micrograph from a sample that had been biased for 1 hour, and then grown on for 5 hours using an apparatus similar to that shown in FIGS. 1A and 1B. The electron beam direction was parallel to the Si<110>, such that the sample was viewed in an exact edge-on condition. An interfacial film is readily observed between the silicon substrate and the diamond film. Several diamond nuclei are seen to be emerging from this interfacial film, and none were observed to be in direct contact with the Si substrate. This divergence of the initial nuclei reconfirms that CVD diamond undergoes three-dimensional growth once the stable nuclei have formed. Twin lamellae, prominent defects in diamond, were also observed just above where the nuclei begin to coalesce as shown by the arrows in FIG. 15.

High resolution TEM images were also obtained in the same region, as shown in FIG. 16. The grainy appearance of this interfacial film under optimum focusing conditions revealed its non-crystalline, or amorphous character. This was then confirmed by electron microdiffraction and optical diffractogramography. EELS was not performed in this region since its thickness was below the spatial resolution limit required for microanalysis in TEM. However, transmission EELS was performed on a separate sample that had a much thicker interfacial film, and the spectra obtained were identical to a spectrum collected from single crystal β-SiC under similar operating conditions. No other elements were found in these EELS spectra. Combined with the in-vacuo surface analysis presented above, applicants theorize without wishing to be bound thereto, that this interfacial film is predominantly amorphous SiC. The interfacial film for the 1 hour bias sample appears to have an average thickness of approximately 60 Å, with some areas as thick as 100 Å.

From a nucleation standpoint, it is important to determine whether the nuclei actually formed on top of this amorphous film, or on the surface of the silicon. Because the sample is being viewed in cross-section, and due to the limited depth of field, the nuclei may only appear to have formed on top of the interfacial film. If one models the nuclei as an inverted pyramid, it is easy to envision how a cross-sectional slice not made in the exact center of the nuclei can make it appear to have originated further from the substrate. However, by tracing the boundaries of the nuclei to a converging point within the apparent interfacial film, it still appears that the nuclei originate above the silicon substrate. This is shown schematically in FIG. 17 and may also be seen in FIG. 16. Furthermore, in all of the samples examined, none of the diamond crystals were observed to be in direct contact with the Si substrate. Therefore, applicants theorize that nucleation did not occur on the silicon substrate directly, but rather on top of the interfacial film.

Along these lines, a schematic summary of a nucleation model, which applicants propose without wishing to be bound thereto, is shown in FIGS. 18A–18F. Before biasing begins, there is both adsorbed oxygen 90 and amorphous carbon 91 present on the silicon substrate 60 surface (FIG. 18A). The adsorbed carbon is then either etched away or converted to Si-C 92 and the physisorbed oxygen is converted into Si-O 93 (FIG. 18B). As biasing continues, the oxide is etched as the Si-C islands 92 continue to grow. Preferential etching of the silicon from the Si-C, and/or continued high flux of carbon to the surface creates an excess concentration of carbon 94 on the surface (FIG. 18C). As the local carbide islands reach a critical thickness, such that the continued carbide growth is unlikely, the excess carbon on the surface becomes free to form small clusters. Surface mobility of the carbon may be enhanced by the bombardment during the biasing. Some of the clusters become favorable for diamond 95 nucleation (FIG. 18D). As most of the carbide reaches a critical thickness, about 90 Å, more free carbon becomes available to form other diamond nucleation sites, and thus a greater number of diamond nuclei are shown in FIG. 18E. As biasing continues, there is ongoing etching of the surface, but not the more stable diamond nuclei, and adsorption of carbon. This local etching creates a rougher SiC surface. If silicon is preferentially etched from the carbide, increasing the carbon concentration in that region, then nucleation clusters may actually form on thinner areas of the carbide. The etching, cluster formation, and diamond nucleation continue until the surface is eventually covered with diamond nuclei as shown in FIG. 18F.

Example 6

In this example, textured diamond growth was achieved on (001) β-SiC substrates using an apparatus similar to that shown in FIGS. 1A and 1B. Prior attempts to grow diamond on on-axis and off-axis β-SiC have been unsuccessful and typical scratching with diamond powder was required in order to obtain significant nucleation. The present results were obtained by pretreating the substrate as described above followed by standard microwave plasma CVD. Using the bias-enhanced nucleation pretreatment according to the present invention, (001) textured diamond particles were grown that were also azimuthally aligned relative to the substrate.

Diamond was deposited on 1 inch (001) β-SiC films that were grown epitaxially in a separate reactor on (001) Si substrates using conventional CVD techniques. The β-SiC films (4–5 μm thick) were prepared by polishing down the surface roughness with 0.1 μm diamond paste and then oxidizing in $O_2$ at 1200° C. to remove the polishing damage. Just prior to insertion into the CVD growth chamber, the oxide was stripped using a 10:1 mixture of HF:DI-$H_2O$ followed by a DI water rinse and drying with nitrogen.

The pretreatment and growth parameters are outlined in Table 7 below.

TABLE 7

| PARAMETER | PRETREATMENT | GROWTH |
|---|---|---|
| $CH_4/H_2$ (%) | 2% | 0.5% |
| Flow Rate (sccm) | 1000 | 1000 |
| Power (watts) | 550 | 600 |
| Pressure (torr) | 15 | 25 |
| Distance from Plasma (cm) | immersed | 1 cm |
| Substrate Temperature (°C.) | 650 | 650–700 |
| Bias, Voltage, Current (V, mA) | −250,100–150 | floating |
| Time (hrs) | 0.5 | 10,35,50 |

The pretreatment consisted of electrically biasing the substrate holder for 30 minutes at −250 volts while it was immersed in a 2% methane-in-hydrogen plasma. The pressure was 15 torr, the microwave power was 600 watts, and total flow rate was 1000 sccm. The substrate temperature was approximately 650° C. and the resulting current was 100–150 mA, collected through the substrate holder with a top surface diameter of 1.5 inches.

After the 30 minute pretreatment, the voltage was turned off, and the substrate was moved to a position approximately 1 cm from the edge of the plasma. The methane concentration was reduced to 0.5%, the pressure increased to 25 torr, and the temperature was maintained at 650°–700° C. These growth conditions resulted in high quality diamond films with little secondary nucleation and modest growth rates of approximately 0.05 μm/hour.

A β-SiC sample was grown on under the above condition for 10, 35, and 50 hours and then subsequently analyzed following each growth period. Scanning electron microscopy (SEM), and Raman spectroscopy were used to characterize the diamond on SiC. After the analysis, the sample was rinsed with DI water, blown dry with nitrogen and then reinserted into the chamber for continued growth. In this manner, changes in the morphology and texture of the diamond could be observed with increased deposition time.

FIGS. 19A–19C show SEM micrographs taken at the center, between the center and the edge, and at the edge, respectively. The arrows, pointing in the SiC <110> direction show that over 50% of the diamond particles on the surface are both textured with (001) faces parallel to the SiC (001) and azimuthally aligned to within 3°, with the diamond <110> parallel to the <110> of SiC. The micrographs also depict the nonuniformity of the diamond deposition. This was most likely due to the relatively short length of the pretreatment which was only 0.5 hours. In other examples, a pretreatment of at least 1 hour was required to achieve uniform nucleation on a silicon substrate.

FIG. 20 shows a schematic representation of an oriented diamond particle 70 on the SiC substrate 60. Higher growth in the <110> than in the <1$\bar{1}$0> has made the top (001) face rectangular rather than square. FIG. 21 shows an SEM taken at 45°, indicating that the (111) are the most stable, slowest growing planes and are, therefore, the largest.

Micro-Raman spectroscopy was performed on the sample after 50 hours of growth in the center region (a), the region between the center and the edge (b), and the edge region (c) as illustrated in the graph of FIG. 22. The spectra show that the diamond is of high quality with an undetectable graphitic component. Also observable are the SiC peaks at 796 and 973 cm−1.

Applicants theorize without wishing to be bound thereto that the biasing pretreatment has played an important role in enhancing the nucleation on the β-SiC substrate without significantly damaging the surface so as to destroy its crystallinity. As described above, bias enhanced nucleation process via in vacuo surface analysis and TEM indicated that diamond nucleation on silicon was preceded by the formation of an interfacial carbide film covered with a very thin (5–10 Å) non-diamond carbon film. It was also found that the biasing process removed oxide and suppressed oxide formation on the surface. Since an amorphous oxide will have deleterious effects on heteroepitaxial nucleation, this oxide removal is believed to be an important factor in the promotion of the present heteroepitaxial nucleation and growth. Attempts to fully remove the oxide from both SiC and Si wafers without biasing proved unsuccessful, thus suggesting that original failures to achieve the heteroepitaxial nucleation of diamond on SiC may have been in part due to the inability to remove the surface oxide.

In the present study, the reduction in pretreatment time (from 1.5 hours in the previous study to 0.5 hours here) was believed to have minimized the surface damage while still creating sufficient nucleation via the impingement of carbon ions from the plasma. Applicants theorize that in conjunction with the oxide suppression, this has allowed the heteroepitaxial nucleation and growth of diamond on SiC in the present study.

This example illustrates that textured and locally heteroepitaxial diamond can be grown on (100) β-SiC substrate. Based on SEM observations, approximately 50% of the diamond nuclei are textured with the (001) parallel to the SiC substrate and are aligned azimuthally within 3°. The biasing pretreatment is theorized by the applicants to enhance the nucleation without damaging the substrate, thus allowing areas of limited epitaxy to occur.

Referring now to FIGS. 23 and 24A–D, the method for selectively etching a diamond film according to the invention is explained. As described above with reference to FIG. 1A, the apparatus 50' illustrated in FIG. 23 has a controllable microwave power source 53' coupled to the chamber or reactor 51' by the rectangular waveguide section 55'. As described below, the power source 53' generates a hydrogen-containing plasma 63' within the reactor 51'. The hydrogen-containing plasma 63' is preferably a substantially pure hydrogen plasma which is free of oxygen or halogen compounds, although trace amounts of methane and other hydrocarbons may be present. The microwave power source 53' may be an ASTeX S-1000, 2.45 GHz microwave supply. As would be readily understood by those skilled in the art, a suitable radio frequency source may also be used to generate a plasma.

The plasma 63' forms at a stable position in a medial portion of the reactor 51'. The substrate holder 57' is connected to the controllable DC power supply 65' to electrically bias the substrate holder 57' with respect to ground, that is, the walls of the reactor 51'. Other electrical bias power supplies such as an AC power supply for periodically providing a negative bias to the substrate holder 57' may also be used in addition to the illustrated DC power supply 65', which provides a pure DC bias. For example, a conventional pulsed-DC power supply, AC (60 Hz) power supply, or RF power supply may also be used to bias the substrate holder 57'.

The substrate holder 57' includes the substrate holding platform 58' which is secured to the end of the tubular body 59'. According to the invention, the substrate platform 58' supports a diamond film 61' thereon. Accordingly, the diamond film 61' may be readily exposed to the plasma 63'.

Referring now more particularly to FIGS. 24A–D, the steps for selectively etching the diamond film 61' will be described. In particular, FIG. 24A illustrates a step of patterning a mask layer 66 on the surface of the diamond film 61'. The mask layer is preferably formed of a material that prevents electron emission from the underlying diamond surface 61b' and is also resistant to the hydrogen-containing plasma 63'. Preferably the mask layer is of a material selected from the group consisting of gold, platinum, refractory metals, and alloys thereof. Other plasma resistant work materials are also contemplated by the invention. For a 1 hour etching cycle, for example, a 200 nm gold mask layer may be used.

Referring now to FIG. 24B, a step of subjecting the mask layer 66 and exposed surface portions of the diamond film 61a' to a hydrogen-containing plasma 63' is illustrated. The subjecting step preferably occurs at a pressure in the range of about 10 to 25 torr, and at a temperature in the range of about 400° to 600° C. To cause etching of the exposed surfaces, the diamond film 61' is negatively biased by the power supply 65' so that electron emission (shown as e⁻) occurs from the exposed diamond surface portions 61a' to the plasma 63'. In combination with the plasma, the emission of electrons from the surface causes a conversion of the surface to nondiamond carbon (e.g., graphite).

The formation of nondiamond on the surface also degrades the electron emission efficiency at the surface. Accordingly, simultaneously with the emission of electrons from the surface, the nondiamond carbon is removed by the surrounding reactive gases which are provided by the plasma 63', as illustrated by FIG. 24C. The etch rate may be controlled by varying the magnitude of the negative bias (e.g., minus 100–300 Volts) and the resulting current flux from the surface 61a'.

According to an aspect of the present invention, anisotropic etching of the diamond film 61' is promoted by the occurrence of electron emission normal to the exposed surface portions 61a', but not from the diamond surface 61b' beneath the mask layer 66. In other words, absent an additional lateral electric field, the microwave plasma 63' will produce electron emission normal to the surface portions 61a' as desirable for anisotropic etching.

Referring now to FIG. 24D, the mask layer 66 can be readily removed with a mixture of aqua regia, thereby exposing diamond mesas 69 having vertical sidewalls 68 as would be readily understood by those skilled in the art.

The above described etching steps may also be performed in a DC plasma reactor. In particular, the diamond film 61' and substrate platform may be mounted on the negative electrode in the DC reactor so that a negatively applied bias simultaneously causes electron emission from the diamond film and sustains the hydrogen-containing plasma. Typical DC plasma conditions include a −400 Volt DC electrode bias, and pressures in the range of about 200 mtorr to 3 torr. The temperature is desirably maintained in the range of about 100° to 600° C. in the plasma. The electrode current is preferably in the range of about 100 to 80 milliamps with an electrode spacing of 0.25 to 7 inches.

Referring now to FIG. 25, a SEM micrograph of a 6 μm thick diamond film which was deposited by a microwave plasma CVD and etched in the same reactor, is illustrated. The film, which was negatively biased in a hydrogen plasma for 1 hour at −250 Volts and 15 torr, shows a high degree of anisotropy with negligible undercutting. The resulting current varied from between 200 and 250 mA and the substrate temperature was approximately 450° C. as measured by an IR-pyrometer looking normal to the substrate. The microwave plasma power was maintained at 800 Watts throughout the process. The etch rate was estimated at greater than 6 μm/hour (or 100 nm/min). The selectivity and accuracy of the etching process are also shown in FIG. 26, in which line widths of less than 2 μm were achieved.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed and that modifications and embodiments are intended to be included within the scope of the appended claims.

That which is claimed:

1. A method for selectively etching a diamond layer comprising the steps of:

forming a mask layer on the diamond layer leaving exposed diamond surface portions and defining a masked diamond layer; and subjecting the masked diamond layer to a hydrogen-containing plasma while negatively biasing the diamond layer at a voltage to cause electron emission from the exposed diamond surface portions and to convert the exposed diamond surface portions to nondiamond carbon, and while the hydrogen-containing plasma continually removes the nondiamond carbon from the exposed diamond surface portions to maintain electron emission efficiency of the exposed diamond surface portions and to thereby selectively etch the diamond layer.

2. A method according to claim 1 wherein the step of subjecting the masked diamond layer to a hydrogen-containing plasma comprises subjecting the masked diamond layer to a substantially pure hydrogen plasma.

3. A method according to claim 1 wherein the step of forming a mask layer comprises forming a mask layer comprising a material preventing electron emission from underlying portions of the diamond layer.

4. A method according to claim 3 wherein the step of forming the mask layer comprises forming the mask layer of a material selected from the group consisting of gold, platinum, refractory metals, and alloys thereof.

5. A method according to claim 1 further comprising the step of positioning the masked diamond layer within a plasma processing chamber, and wherein the step of subjecting the masked diamond layer to a hydrogen-containing plasma comprises supplying microwave or radio frequency energy to the plasma processing chamber to generate the hydrogen-containing plasma therein.

6. A method according to claim 5 wherein the step of negatively biasing the diamond layer comprises negatively biasing the diamond layer with a signal having at least a portion thereof at an absolute value of greater than about 100 volts.

7. A method according to claim 5 wherein the step of subjecting the masked diamond layer to a hydrogen-containing plasma comprises subjecting the masked diamond layer to a hydrogen-containing plasma at a pressure in a range of about 10 to 25 torr within the plasma processing chamber.

8. A method according to claim 5 wherein the step of subjecting the masked diamond layer to a hydrogen-containing plasma comprises subjecting the masked diamond layer to a hydrogen-containing plasma at a temperature in a range of about 400° to 600° C. within the plasma processing chamber.

9. A method according to claim 1 further comprising the step of positioning the masked diamond layer within a plasma processing chamber, and wherein the step of negatively biasing the diamond layer comprises negatively biasing the diamond layer at a voltage to cause electron emission from the exposed diamond surface portions and also to generate the hydrogen-containing plasma within the plasma processing chamber.

10. A method according to claim 9 wherein the step of negatively biasing the diamond layer comprises negatively biasing the diamond layer with a signal having at least a portion thereof at an absolute value of greater than about 400 volts.

11. A method according to claim 9 wherein the step of subjecting the mask layer and the exposed surface portions of the diamond layer to a hydrogen-containing plasma comprises subjecting the masked diamond layer to a hydrogen-containing plasma at a pressure in a range of about 200 mtorr to 3 torr within the plasma processing chamber.

12. A method according to claim 9 wherein the step of subjecting the masked diamond layer to a hydrogen-containing plasma comprises subjecting the masked diamond layer to a hydrogen-containing plasma at a temperature in a range of about 100° to 600° C. within the plasma processing chamber.

13. A method for anisotropically selectively etching a diamond layer comprising the steps of:
    forming a mask layer on the diamond layer leaving exposed diamond surface portions and defining a masked diamond layer; and
    subjecting the masked diamond layer to a hydrogen-containing plasma while negatively biasing the diamond layer at a voltage to cause electron emission from the exposed diamond surface portions in a direction normal to the exposed diamond surface portions and to convert the exposed diamond surface portions to non-diamond carbon, and while the hydrogen-containing plasma continually removes the nondiamond carbon from the exposed diamond surface portions to maintain electron emission efficiency of the exposed diamond surface portions and to thereby anisotropically selectively etch the diamond layer.

14. A method according to claim 13 wherein the step of subjecting the masked diamond layer to a hydrogen-containing plasma comprises subjecting the masked diamond layer to a substantially pure hydrogen plasma.

15. A method according to claim 1 wherein the step of forming a mask layer comprises forming a mask layer comprising a material preventing electron emission from underlying portions of the diamond layer.

16. A method according to claim 15 wherein the step of forming the mask layer comprises forming the mask layer of a material selected from the group consisting of gold, platinum, refractory metals, and alloys thereof.

17. A method according to claim 13 further comprising the step of positioning the masked diamond layer within a plasma processing chamber, and wherein the step of subjecting the masked diamond layer to a hydrogen-containing plasma comprises supplying microwave or radio frequency energy to the plasma processing chamber to generate the hydrogen-containing plasma therein.

18. A method according to claim 17 wherein the step of negatively biasing the diamond layer comprises negatively biasing the diamond layer with a signal having at least a portion thereof at an absolute value of greater than about 100 volts.

19. A method according to claim 17 wherein the step of subjecting the masked diamond layer to a hydrogen-containing plasma comprises subjecting the masked diamond layer to a hydrogen-containing plasma at a pressure in a range of about 10 to 25 torr within the plasma processing chamber.

20. A method according to claim 17 wherein the step of subjecting the masked diamond layer to a hydrogen-containing plasma comprises subjecting the masked diamond layer to a hydrogen-containing plasma at a temperature in a range of about 400° to 600° C. within the plasma processing chamber.

21. A method according to claim 13 further comprising the step of positioning the masked diamond layer within a plasma processing chamber, and wherein the step of negatively biasing the diamond layer comprises negatively biasing the diamond layer at a voltage to cause electron emission from the exposed diamond surface portions and also to generate the hydrogen-containing plasma within the plasma processing chamber.

22. A method according to claim 21 wherein the step of negatively biasing the diamond layer comprises negatively biasing the diamond layer with a signal having at least a portion thereof at an absolute value of greater than about 400 volts.

23. A method according to claim 21 wherein the step of subjecting the mask layer and the exposed surface portions of the diamond layer to a hydrogen-containing plasma comprises subjecting the masked diamond layer to a hydrogen-containing plasma at a pressure in a range of about 200 mtorr to 3 torr within the plasma processing chamber.

24. A method according to claim 21 wherein the step of subjecting the masked diamond layer to a hydrogen-containing plasma comprises subjecting the masked diamond layer to a hydrogen-containing plasma at a temperature in a range of about 100° to 600° C. within the plasma processing chamber.

25. A method for selectively etching a diamond layer comprising the steps of:

- forming a mask layer on the diamond layer leaving exposed diamond surface portions and defining a masked diamond layer, the mask layer comprising a material preventing electron emission from underlying portions of the diamond layer; and
- subjecting the masked diamond layer to a pure hydrogen plasma while negatively biasing the diamond layer at a voltage to cause electron emission from the exposed diamond surface portions and to convert the exposed diamond surface portions to nondiamond carbon, and while the pure hydrogen plasma continually removes the nondiamond carbon from the exposed diamond surface portions to maintain electron emission efficiency of the exposed diamond surface portions and to thereby selectively etch the diamond layer.

26. A method according to claim 1 wherein the step of forming the mask layer comprises forming the mask layer of a material selected from the group consisting of gold, platinum, refractory metals, and alloys thereof.

27. A method according to claim 25 further comprising the step of positioning the masked diamond layer within a plasma processing chamber, and wherein the step of subjecting the masked diamond layer to a pure hydrogen plasma comprises supplying microwave or radio frequency energy to the plasma processing chamber to generate the pure hydrogen plasma therein.

28. A method according to claim 27 wherein the step of negatively biasing the diamond layer comprises negatively biasing the diamond layer with a signal having at least a portion thereof at an absolute value of greater than about 100 volts.

29. A method according to claim 25 further comprising the step of positioning the masked diamond layer within a plasma processing chamber, and wherein the step of negatively biasing the diamond layer comprises negatively biasing the diamond layer at a voltage to cause electron emission from the exposed diamond surface portions and also to generate the pure hydrogen plasma within the plasma processing chamber.

30. A method according to claim 29 wherein the step of negatively biasing the diamond layer comprises negatively biasing the diamond layer with a signal having at least a portion thereof at an absolute value of greater than about 400 volts.

* * * * *